United States Patent
Tsukazawa et al.

(10) Patent No.: US 10,170,300 B1
(45) Date of Patent: Jan. 1, 2019

(54) PROTECTIVE FILM FORMING METHOD

(71) Applicant: Tokyo Electron Limited, Tokyo (JP)

(72) Inventors: Shogo Tsukazawa, Iwate (JP);
Chihhsiang Hsiao, Iwate (JP);
Masafumi Ishida, Beaverton, OR (US);
Yutaka Takahashi, Iwate (JP); Atsushi Endo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/827,264

(22) Filed: Nov. 30, 2017

(51) Int. Cl.
*H01L 21/02* (2006.01)
*B05D 1/00* (2006.01)
*H01L 21/687* (2006.01)
*H01L 21/3205* (2006.01)
*C23C 16/455* (2006.01)

(52) U.S. Cl.
CPC .......... *H01L 21/02274* (2013.01); *B05D 1/60* (2013.01); *B05D 1/62* (2013.01); *C23C 16/45536* (2013.01); *H01L 21/0228* (2013.01); *H01L 21/02315* (2013.01); *H01L 21/02554* (2013.01); *H01L 21/32056* (2013.01); *H01L 21/68764* (2013.01)

(58) Field of Classification Search
CPC ......... H01L 21/02274; H01L 21/02554; H01L 21/32056; H01L 21/02315; H01L 21/0228; H01L 21/68764; C23C 16/45536; B05D 1/60; B05D 1/62
See application file for complete search history.

(56) References Cited

U.S. PATENT DOCUMENTS

| | | | | |
|---|---|---|---|---|
| 2004/0208994 | A1* | 10/2004 | Harkonen | C23C 16/32 427/249.1 |
| 2006/0063346 | A1* | 3/2006 | Lee | C23C 16/45531 438/393 |
| 2010/0055312 | A1* | 3/2010 | Kato | C23C 16/45502 427/255.26 |

FOREIGN PATENT DOCUMENTS

| | | |
|---|---|---|
| JP | 2010-103242 | 5/2010 |
| JP | 2017-120884 | 7/2017 |

\* cited by examiner

*Primary Examiner* — Karen Kusumakar
(74) *Attorney, Agent, or Firm* — IPUSA, PLLC

(57) ABSTRACT

A protective film forming method is provided. In the method, an oxide film of either an organic metal compound or an organic metalloid compound is deposited on a flat surface region between adjacent recessed shapes formed in a surface of a substrate. Then, a lateral portion of the oxide film deposited on the flat surface region is removed by etching.

16 Claims, 18 Drawing Sheets

FIG.10

| COMMON NAME | MOLECULAR FORMULA | NAME |
|---|---|---|
| TMA | $(CH_3)_3Al$ | TRIMETHYLALUMINIUM |
| ZyALD (REGISTERED TRADEMARK) | $C_{11}H_{23}N_3Zr$ | TRIS(DIMETHYLAMINOCYCLOPENTADIENYL)ZIRCONIUM |
| TiMCTA | $CH_3C_5H_4Ti[N(CH_3)_2]_3$ | TRIS(DIMETHYLAMINO)METHYLCYCLOPENTADIENYLTITANIUM |
| 3DMASi | $[(CH_3)_2N]_3SiH$ | TRIS(DIMETHYLAMINO)SILANE |
| TEMAZ | $[CH_3CH_2(CH_3)N]_4Zr$ | TETRAKIS(N-ETHYLMETHYLAMINO)ZIRCONIUM |
| TEMAH | $[CH_3CH_2(CH_3)N]_4Hf$ | TETRAKIS(N-ETHYLMETHYLAMINO)HAFNIUM |
| TDMAH | $Hf[N(CH_3)_2]_4$ | TETRAKIS(DIMETHYLAMINO)HAFNIUM |
| TDMAT | $[(CH_3)_2N]_4Ti$ | TETRAKIS(N, N-DIMETHYLAMINO)TITANIUM |

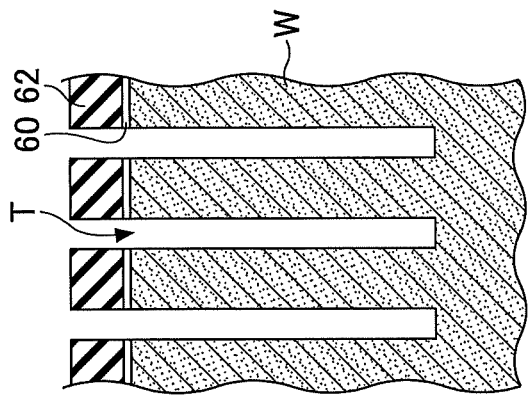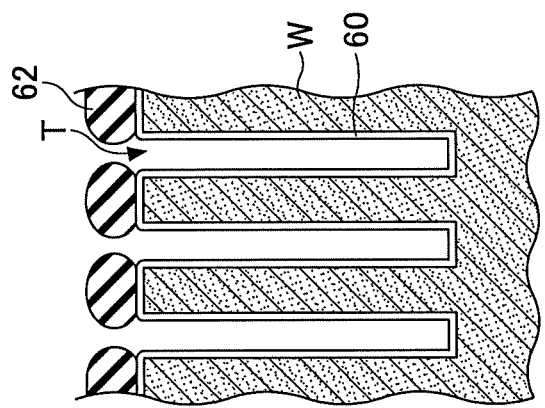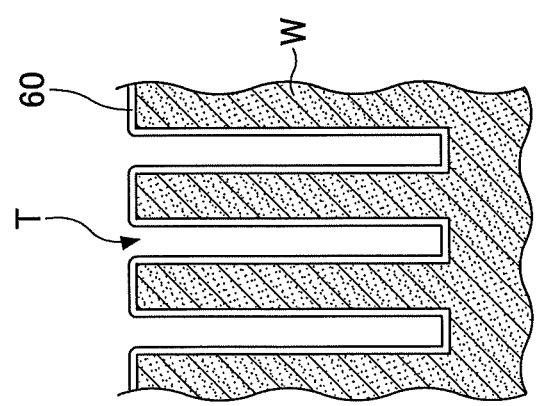

PROTECTIVE FILM FORMING METHOD

BACKGROUND OF THE INVENTION

1. Field of the Invention

The present invention relates to a protective film forming method.

2. Description of the Related Art

Conventionally, a method of manufacturing a semiconductor device that has a trench formed in a LOCOS (Local Oxidation of Silicon) oxide film is known as disclosed in Japanese Laid-Open Patent Application Publication No. 2010-103242. In the method, the LOCOS oxide film is formed in a surface of a silicon layer, and an impurity region is formed in the silicon layer by implanting impurities into the silicon layer. After that, a SiN layer and a $SiO_2$ layer are deposited on the silicon layer, and an opening is selectively formed in the SiN layer and the $SiO_2$ layer by photolithography and etching. The trench is formed in the LOCOS oxide film and the silicon layer by using the SiN layer and the $SiO_2$ layer as a mask.

In the meantime, along with development of miniaturization in recent years, it has been getting difficult to form a contact hole in a desired target material at an accurate position. Moreover, producing a mask to form a contact hole with the same size as the target has been also getting difficult. To avoid these problems, a protective film that prevents a portion except for a desired etching portion from being etched even if there is an alignment error, needs to be formed, but it is very difficult to leave such a protective film regionally due to limits of lithography accuracy. To solve these problems, a method for forming a protective film only at a desired location in a self-aligned manner is desired.

Japanese Laid-Open Patent Application Publication No. 2017-120884 discloses a protective film forming method for selectively forming a protective film on a region between multiple recessed shapes such as trenches as a method for regionally forming a protective film without using lithography. In the protective film forming method disclosed in Japanese Paid-Open Patent Application Publication No. 2017-120884, Atomic Layer Deposition (ALD) is performed while rotating a turntable at high speed in a state where a source gas does not flow into the recesses, thereby regionally depositing a film only on a region where the recess is not formed but has a flat surface and forming a protective film. Thus, the protective film can be formed without using the lithography, and is expected to become a technique that can sufficiently respond to the miniaturization.

However, when the thickness of the protective film is desired to be made thicker, if the film deposition process is repeated, the protective film grows not only upward but also laterally, and is liable to be formed to cover part of openings of the recesses. Moreover, to respond to further miniaturization in the future, a method for adjusting a shape of the protective film is expected.

SUMMARY OF THE INVENTION

An embodiment of the present invention provides a protective film forming method capable of adjusting a shape of a protective film and making the protective film grow thick upward.

According to an embodiment, there is provided a protective film forming method. In the method, an oxide film of either an organic metal compound or an organic metalloid compound is deposited on a flat surface region between adjacent recessed shapes formed in a surface of a substrate. Then, a lateral portion of the oxide film deposited on the flat surface region is removed by etching.

Note that also arbitrary combinations of the above-described constituents, and any exchanges of expressions in the present invention, made among methods, devices, systems and so forth, are valid as embodiments of the present invention.

BRIEF DESCRIPTION OF THE DRAWINGS

FIG. 10 is a table showing examples of a source gas applicable to a protective film forming method according to an embodiment of the present invention;

FIGS. 14A through 14C are diagrams illustrating an example of a sacrificial film forming process of a protective film forming method according to an embodiment;

DETAILED DESCRIPTION OF THE PREFERRED EMBODIMENTS

The embodiments of the present invention are described below with reference to the accompanying drawings.

[Film Deposition Apparatus]

To begin with, a film deposition apparatus for performing a protective film forming method according to an embodiment is described below. The protective film forming method according to the embodiments can be performed by various film deposition apparatuses as long as types of gases to be supplied to a substrate can be switched quickly, and a form of film deposition apparatus is not limited to a specific form. Here, an example of film deposition apparatus that can switch types of gases to be supplied to a substrate at high speed is described below.

Figure 1:
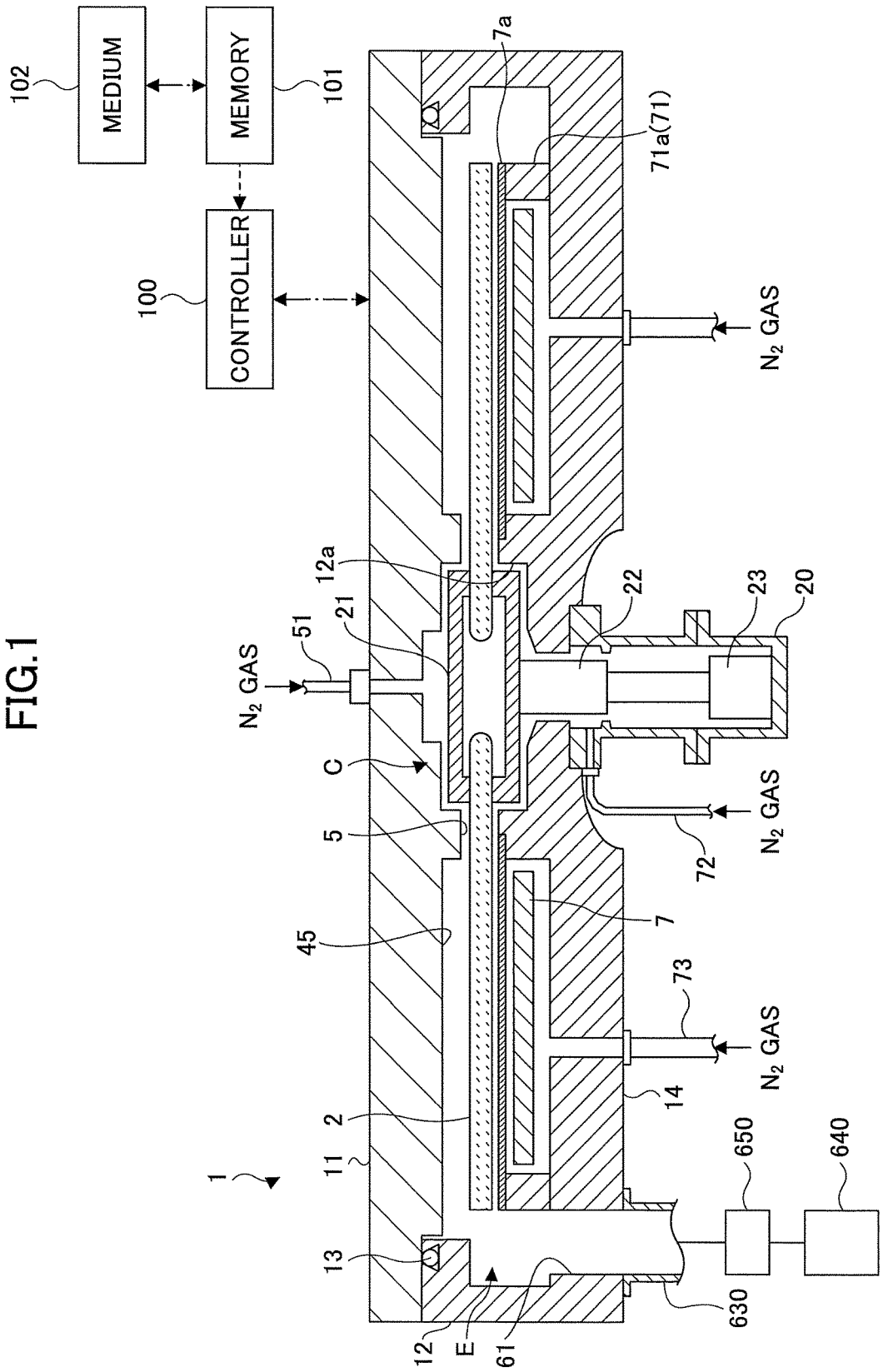
FIG. 1 a schematic cross-sectional view of a film deposition apparatus according to an embodiment of the present invention.
Figure 2:
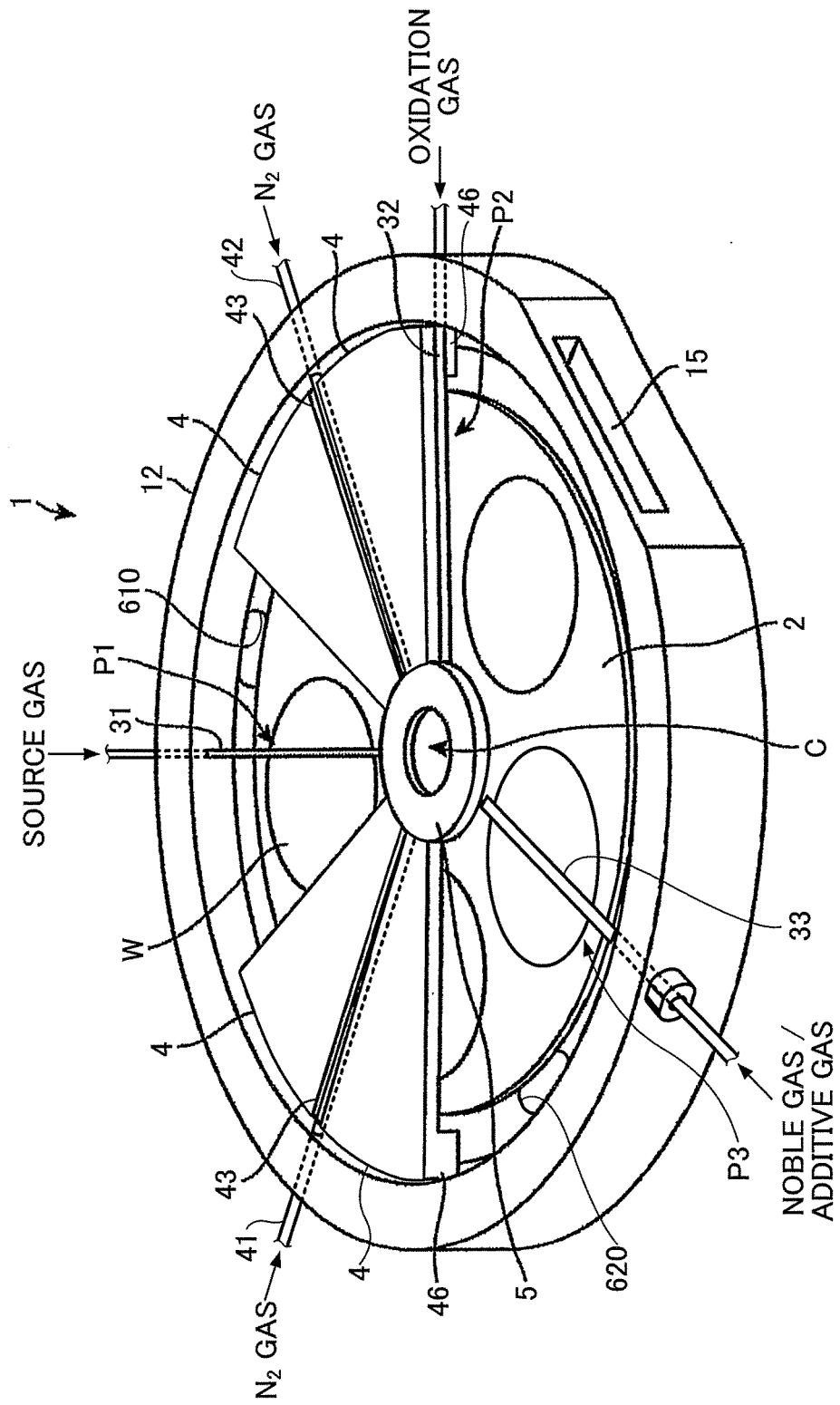
FIG. 2 is a schematic perspective view illustrating an inner structure of a vacuum chamber of the film deposition apparatus illustrated in FIG. 1.
Figure 3:
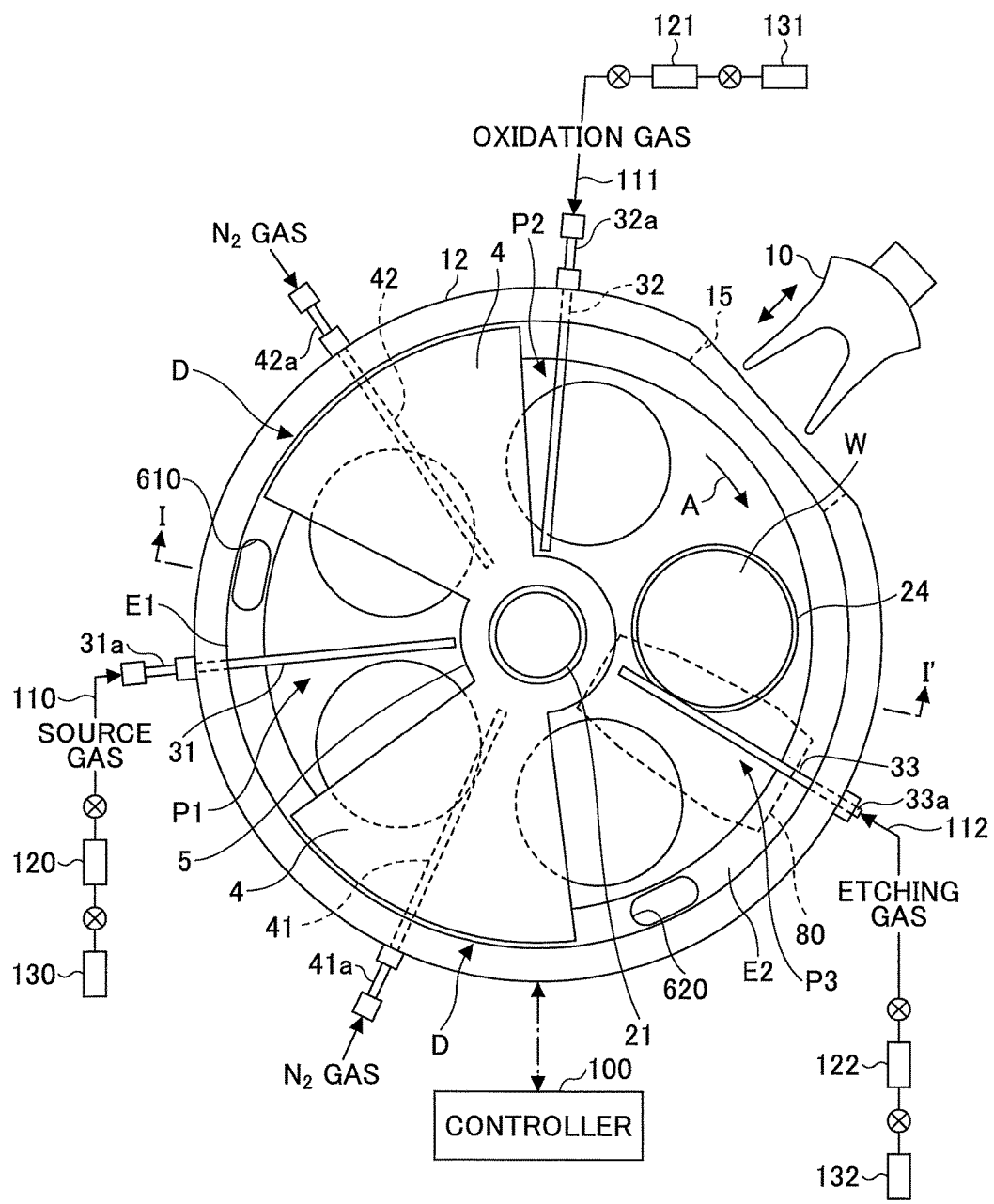
FIG. 3 is a schematic top view illustrating an inner structure of the vacuum chamber of the film deposition apparatus illustrated in FIG. 1.

With reference to FIGS. 1 through 3, the film deposition apparatus includes a vacuum chamber 1 having a substantially flat circular shape and a turntable 2 having the center common with the center of the vacuum chamber 1. The vacuum chamber 1 is a process chamber to perform a film deposition process on a surface of a wafer containing therein. The vacuum chamber 1 includes a chamber body 12 having a cylindrical shape with a bottom surface, and a ceiling plate 11 placed on the upper surface of the chamber body 12. The ceiling plate 11 is hermetically and detachably placed on the chamber body 12 via a sealing member 13 (FIG. 1) such as an O-ring.

The turntable 2 is fixed to the cylindrical shaped core unit 21 at its center portion. The core unit 21 is fixed to the upper end of the rotary shaft 22 which extends in the vertical direction. The rotary shaft 22 is provided to penetrate the bottom portion 14 of the vacuum chamber 1 and its lower end is attached to a drive unit 23 that rotates the rotary shaft 22 (FIG. 1) about a vertical axis. The rotary shaft 22 and the drive unit 23 are housed in a tubular case body 20 whose upper surface is open. The case body 20 is hermetically attached to a lower surface of the bottom portion 14 of the vacuum chamber 1 via a flange portion provided at its upper surface so that the inner atmosphere of the case body 20 is isolated from the outside atmosphere.

Although detailed later, in the protective film forming method according to the embodiment of the present invention, the turntable 2 is rotated at a high speed of 120 rpm or higher, for example, at a predetermined high speed in a rage of 120 to 300 rpm. Thus, the drive unit 23 is configured to be able to rotate the turntable 2 at a high speed of at least in a range of 120 to 300 rpm. In ordinary film deposition processes, the rotational speed of the turntable 2 is set in a range of 20 to 30 rpm in many cases.

Although detailed later, the protective film forming method according to the embodiment may include a process of rotating the turntable 2 at a speed lower than 120 rpm, such as 60 rpm. Hence, the turntable 2 is also configured to be able to rotate at a low speed.

FIG. 2 and FIG. 3 are diagrams illustrating an inner structure of the vacuum chamber 1. The ceiling plate 11 is not illustrated in FIG. 2 and FIG. 3 for an explanatory purpose.

As illustrated in FIG. 2 and FIG. 3, a plurality of (five in this case) circular concave portions 24 is provided in a top surface of the turntable 2 along a rotating direction (circumferential direction) illustrated by an arrow A for holding a plurality of semiconductor wafers (which will be simply referred to as "wafers" hereinafter) W, respectively. Here is an example where a single wafer W is illustrated to be placed in one of the concave portions 24 in FIG. 3 for an explanatory purpose. Each of the concave portions 24 is formed to have the slightly larger (for example, 4 mm larger) diameter than that (for example, 300 mm) of the wafer W, and the depth substantially equal to the thickness of the wafer W. Thus, when the wafer W is mounted in the concave portion 24, the surface of the wafer W and the surface of the turntable 2 (where the wafer W is not loaded) become almost the same height. Each of the concave portions 24 has, for example, three through holes (not illustrated in the drawings), through which lift pins (not illustrated in the drawings) for supporting a back surface of the wafer W and lifting the wafer W penetrate.

As illustrated in FIGS. 2 and 3, a reaction gas nozzle 31, a reaction gas nozzle 32, a reaction gas nozzle 33 and separation gas nozzles 41 and 42, which are made of quartz, for example, are provided above the turntable 2. In the example illustrated in FIG. 3, the reaction gas nozzle 33, the separation gas nozzle 41, the reaction gas nozzle 31, the separation gas nozzle 42, and the reaction gas nozzle 32 are aligned in this order from a transfer port 15 (which will be explained later) in a clockwise direction (the rotation direction of the turntable 2 as shown by an arrow A in FIG. 3) with a space therebetween in a circumferential direction of the vacuum chamber 1. Gas introduction ports 31a, 32a, 33a, 41a, and 42a (FIG. 3) which are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 to extend in a radial direction and parallel to the surface of the turntable 2.

As illustrated in FIG. 3, in this embodiment, the reaction gas nozzle 31 is connected to a source gas supply source 130 via a pipe 110, a flow controller 120 and the like. The reaction gas nozzle 32 is connected to an oxidation gas ($H_2O$, $H_2O_2$, $O_2$ or $O_3$) supply source 131 via a pipe 111, a flow controller 121 and the like. Moreover, the reaction gas nozzle 33 is connected to an etching gas supply source 132 via a pipe 112, a flow controller 122 and the like. A halogen based gas including fluorine based gas such as $CF_4$, $C_2F_6$, $CH_3F$, $CH_3F$, $CHF_3$, $Cl_2$, $CLF_3$, $BCl_3$, $NF_3$ and the like can be used as the etching gas, but the etching gas is not limited to a specific gas as long as the etching gas can perform etching. The separation gas nozzles 41 and 42 are connected to separation gas supply sources (not illustrated in the drawings) via pipes and flow controllers (not illustrated in the drawings). A noble gas such as helium (He) or argon (Ar) or an inert gases such as nitrogen ($N_2$) gas can be used as a separation gas. In the embodiment, an example of using $N_2$ gas as the separation gas is described.

A variety of organometallic gases and organic metalloid gases can be used as the source gas supplied from the reaction gas nozzle 31 depending on the intended use.

Each of the reaction gas nozzles 31, 32 and 33 has a plurality of gas discharge holes 35 (see FIG. 4) which face downward to the turntable 2 along the longitudinal directions of the reaction gas nozzles 31, 32 and 33 at 10 mm intervals, for example. A region below the reaction gas nozzle 31 is a first process region P1 in which the source gas is adsorbed on the wafer W. A region below the reaction gas nozzle 32 is a second process region P2 in which an oxidation gas to oxidize the source gas adsorbed on the wafer W at the first process region P1 is supplied and produce a molecular layer of an oxide of an organic metal compound or an organic metalloid compound contained in the source gas as a reaction product. Here, the molecular layer of the oxide of the organic metal compound or the organic metalloid compound forms a deposited protective film. A region below the reaction nozzle 33 is a third process region P3 in which the after the organic metal oxide compound or the organic metalloid oxide compound (protective film) deposited by the oxidation in the second process region is grown upward, and an unnecessary portion of the protective film that have grown in a lateral direction is removed by etching. As schematically illustrated in FIG. 3, a plasma generator 80 may be provided at the third process region P3 as necessary. Moreover, in the second process region P2, oxygen gas activated by thermal oxidation may be supplied, or oxygen gas activated by plasma may be supplied. When activating oxygen gas by plasma, a plasma generator may be also provided in the second process region P2.

Here, because the first process region P1 is a region to adsorb the source gas on the wafer W, the first process region P1 may be also referred to as a "source gas adsorption region P1." Similarly, because the second process region P2 is a region to oxidize the source gas adsorbed on the surface of the wafer W, the second process region P2 may be also referred to as an "oxidation region." Furthermore, because the third process region P3 is a region to etch side surfaces of the protective film, the third process region P3 may be also referred to as an "etching region."

Providing the plasma generator 80 on the upper side of the third process region P3 is not necessary. For example, when an etching gas that has a sufficient etching intensity is used, the etching can be performed without using the plasma generator 80. Thus, the plasma generator 80 may be provided as necessary.

Thus, the protective film forming method according to the embodiments can include a variety of oxidation processes and etching processes, and the film deposition apparatus can take a variety of configurations depending on the selected processes.

Here, in FIG. 3, the plasma generator 80 is illustrated by a dotted line by being simplified. The plasma generator 80 is detailed later.

As discussed above, the source gas supplied from the reaction gas nozzle 31 is the organometallic gas or the organic metalloid gas. A variety of the organometallic gas and the organic metalloid gas are available for the source gas, which is selected depending on a type of the protective film to be formed. For example, an organometallic gas that is used for film deposition of a high-k film may be used as the metal organic gas. Various gases containing an organic metal compound may be used as the organometallic gas, and for example, when forming a protective film of $TiO_2$, a gas containing an organic titanium gas such as TDMAT (tetrakis (dimethylamino)titanium) is selected. Moreover, the organic silane gas, for example, an organic aminosilane gas such as 3DMAS (tris(dimethylamino)silane) may be used as the organic metalloid gas. These organometallic gas or organic metalloid gas may be supplied by vaporizing an organic metal compound or an organic metalloid compound using a vaporizer to produce the organometallic gas or the organic metalloid gas, and then the produced organometallic gas or the produced organic metalloid gas is supplied by using a carrier gas into the vacuum chamber 1.

A variety of oxidation gases can be used as the oxidation gas supplied from the reaction gas nozzle 32 as long as the oxidation gas can produce an organic metal oxide or an organic metalloid oxide by reacting with the supplied organometallic gas or the organic metalloid gas. For example, when oxidizing the organometallic gas by thermal oxidation, $H_2O$, $H_2O_2$, $O_2$, $O_3$ and the like are selected as the oxidation gas.

A variety of etching gases can be selected as the etching gas supplied from the reaction gas nozzle 33 as long as the etching gas can etch the protective film made of the organic metal oxide film or the organic metalloid oxide film. For example, a fluorine-containing gas may be used. $CF_4$, $ClF_3$ and the like are cited as examples of the fluorine-containing gas. As discussed above, whether to provide the plasma generator 80 may be determined depending on the selected etching gas.

Referring to FIG. 2 and FIG. 3, the ceiling plate 11 includes two convex portions 4 in the vacuum chamber 1. Each of the convex portions 4 is attached to the back surface of the ceiling plate 11 so as to protrude toward turntable 2 to form a separation region D with the separation gas nozzles 41 or 42. Each of the convex portions 4 has substantially a fan-like top view shape where the apex is removed in an arc shape. The inner arc shaped portion of each of the convex portions 4 is connected to a protruding portion 5 (which will be explained later with reference to FIG. 1 to FIG. 3) and the outer arc shaped portion is arranged to extend along an inner peripheral surface of the chamber body 12 of the vacuum chamber 1.

Figure 4:
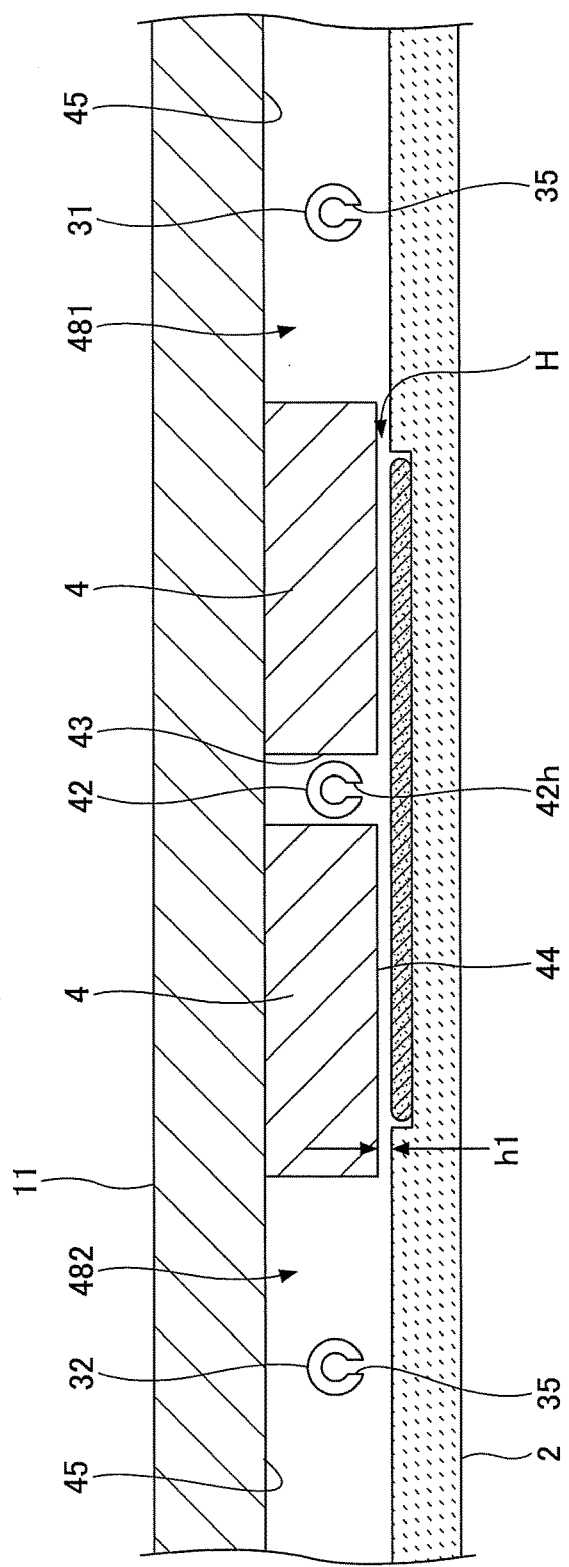
FIG. 4 is a partial cross-sectional view of a vacuum chamber taken along a concentric circle of a turntable of the film deposition apparatus illustrated in FIG. 1.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, there are provided a flat low ceiling surface 44 (first ceiling surface) formed as the lower surface of the convex portion 4 and flat higher ceiling surfaces 45 (second ceiling surface) which are higher than the low ceiling surface 44 and formed on both sides of the low ceiling surface 44 in the circumferential direction. The low ceiling surface 44 has substantially a fan-like top view shape where the apex is removed in an arc shape. Furthermore, as illustrated in the drawings, the convex portion 4 has a groove portion 43 at a center in the circumferential direction. The groove portion 43 is formed to extend in the radial direction of the turntable 2. The separation gas nozzle 42 is positioned within the groove portion 43. Although not illustrated in FIG. 4, the separation gas nozzle 41 is also positioned within a groove portion provided in the other convex portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, as illustrated in FIG. 4, the reaction gas nozzle 31 is provided in the right side space 481 under the high ceiling plate 45, and the reaction gas nozzle 32 is provided in the left side space 482 under the high ceiling surface 45.

Each of the separation gas nozzles 41 and 42 has a plurality of gas discharge holes 42h formed along the longitudinal direction of each of the separation gas nozzles 41 and 42 at predetermined intervals (10 mm, for example).

The low ceiling surface 44 provides a separation space H, which is a narrow space, with respect to the turntable 2. When $N_2$ gas is supplied from the separation gas nozzle 42, $N_2$ gas flows toward the space 481 and the space 482 through the separation space H. At this time, as the volume of the separation space H is smaller than those of the spaces 481 and 482, the pressure in the separation space H can be made higher than those in the spaces 481 and 482 by $N_2$ gas. This means that the separation space H having the high pressure is formed between the spaces 481 and 482. Further, $N_2$ gas flowing from the separation space H toward the spaces 481 and 482 functions as a counter flow against the source gas from the gas first process region P1 and the oxidation gas from the second process region P2. Thus, the source gas from the first process region P1 and the oxidation gas from the second process region P2 are separated by the separation space H. Therefore, mixing and reacting of the reaction gas with the oxidation gas are prevented in the vacuum chamber 1.

The height h1 of the low ceiling surface 44 above an upper surface of the turntable 2 may be appropriately determined based on the pressure of the vacuum chamber 1, the rotational speed of the turntable 2, and a supplying amount of the separation gas ($N_2$ gas) during the film deposition in order to keep the pressure in the separation space H higher than those in the spaces 481 and 482.

Referring to FIG. 1 through FIG. 3, the ceiling plate 11 further includes the protruding portion 5 at its lower surface to surround the outer periphery of the core unit 21 which supports the turntable 2. The protruding portion 5 is continuously formed with the inner portions of the convex portions 4 and has a lower surface which is formed at the same height as those of the low ceiling surfaces 44, in this embodiment.

Figure 5:
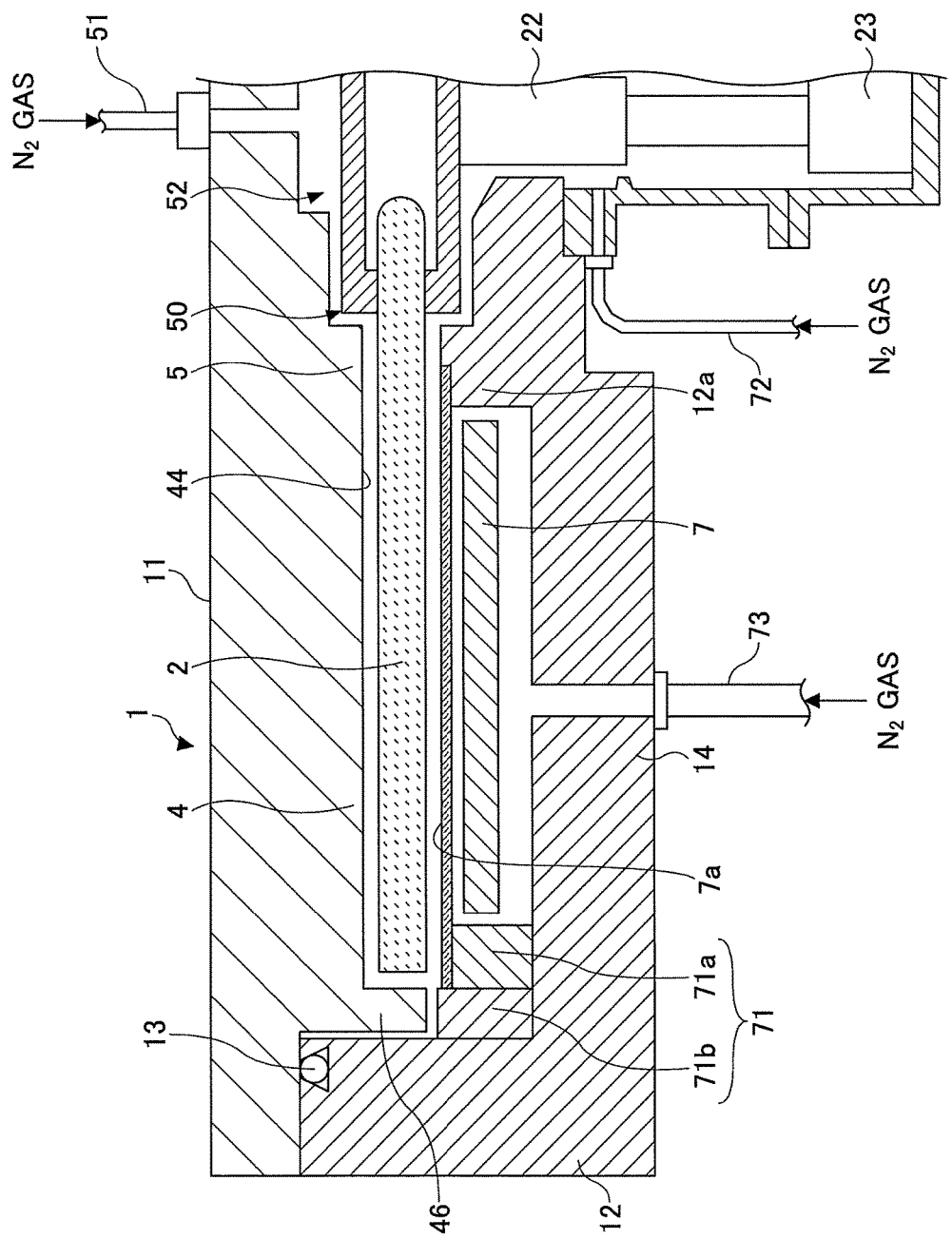
FIG. 5 is another schematic cross-sectional view of the film deposition apparatus illustrated in FIG. 1

FIG. 1 is a cross-sectional view taken along an I-I' line in FIG. 3, and illustrating an area where the ceiling surface 45 is provided. FIG. 5 is a partial cross-sectional view illustrating an area where the ceiling surface 44 is provided.

As shown in FIG. 5, the convex portion 4 having a substantially fan-like top view shape includes an outer bending portion 46 at its outer peripheral end portion (at an outer peripheral end portion side of the vacuum chamber 1) which is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, there is a slight space between the outer periphery surface of the outer bending portion 46 and the chamber body 12. The space between the inner periphery surface of the outer bending portion 46 and an outer surface of the turntable 2, and the space between the outer peripheral surface of the outer bending portion 46 and the chamber body 12 may be the same size as the height h1 (see FIG. 4) of the low ceiling surface 44 with respect to the upper surface of the turntable 2, for example.

As shown in FIG. 5, the inner perimeter wall of the chamber body 12 is provided to extend in a vertical direction to be closer to the outer peripheral surface of the outer bending portion 46 at the separation area H. However, other than the separation area H, as shown in FIG. 1, for example, the inner perimeter wall of the chamber body 12 is formed to have a depressed portion outside of a portion facing the outer end surface of the turntable 2 toward the bottom portion 14. Hereinafter, for an explanatory purpose, the depressed portion, having a substantially rectangular cross-sectional view, is referred to as an "evacuation region". Specifically, a part of the evacuation region which is in communication with the first process area P1 is referred to as a first evacuation region E1, and a part of the evacuation region which is in communication with the second process area P2 is referred to as a second evacuation region E2. As illustrated in FIG. 1 through FIG. 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Pressure controllers 650 are provided between the vacuum pumps 640 and the evacuation pipes 630.

A heater unit 7 is provided in a space between the turntable 2 and the bottom portion 14 of the vacuum chamber 1 as illustrated in FIG. 1 and FIG. 5. The wafers W loaded on the turntable 2 are heated by the heater unit 7 via the turntable 2 to a temperature (150° C., for example) determined by a process recipe. A ring-shaped cover member 71 is provided at a lower portion side of the outer periphery of the turntable 2 in order to prevent gasses from being introduced into the space below the turntable 2. As illustrated in FIG. 5, the cover member 71 includes an inner member 71a which is provided to face the outer edge portion and the further outer portion of the turntable 2 from a lower side, and an outer member 71b which is provided between the inner member 71a and an inner wall surface of the chamber body 12. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer end portion) of the turntable 2.

As illustrated in FIG. 1, the bottom portion 14 of the vacuum chamber 1 closer to the rotation center than the space where the heater unit 7 is positioned protrudes upward to be close to the core unit 21 to form a protruded portion 12a. There is provided a narrow space between the protruded portion 12a and the core unit 21. Further, there is provided a narrow space between an inner peripheral surface of the bottom portion 14 and the rotary shaft 22 to be in communication with the case body 20. A purge gas supplying pipe 72 which supplies $N_2$ gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at predetermined angle intervals in the circumferential direction below the heater unit 7 for purging the space where the heater unit 7 is provided. Further, a cover member 7a is provided between the heater unit 7 and the turntable 2 to prevent the gas from being introduced into the space where the heater unit 7 is provided. The cover member 7a is provided to extend from an inner peripheral wall (upper surface of the inner member 71a) of the outer member 71b to an upper end portion of the protruded portion 12a in the circumferential direction. The cover member 7a may be made of quartz, for example.

The film deposition apparatus further includes a separation gas supplying pipe 51 which is connected to a center portion of the ceiling plate 11 of the vacuum chamber 1 and provided to supply $N_2$ gas as the separation gas to the space 52 between the ceiling plate 11 and the core unit 21. The separation gas supplied to the space 52 flows through a narrow space between the protruding portion 5 and the turntable 2 to flow along a top surface of the turntable 2 where the wafers W are to be loaded to be discharged from an outer periphery. The space 50 is kept at a pressure higher those of the space 481 and the space 482 by the separation gas. Thus, the mixing of the organometallic gas supplied to the first process region P1 and the oxidation gas supplied to the second process region P2 by flowing through the center area C can be prevented by the space 50. This means that the space 50 (or the center area C) can function similarly to the separation space H (or the separation area D).

Further, as illustrated in FIG. 2 and FIG. 3, a transfer port 15 is provided at a side wall of the vacuum chamber 1 for allowing the wafers W, which are substrates, to pass between an external transfer arm 10 and the turntable 2. The transfer port 15 is opened and closed by a gate valve (not illustrated in the drawings). Further, because the wafer W is transferred at a position where the concave portion 24 faces the transfer port 15, lift pins, which penetrate the concave portion 24 to lift up the wafer W from a backside surface, and a lifting mechanism for the lift pins (both are not illustrated in the drawings) are provided below the turntable 2 at a position where the wafer W is transferred. Thus, the respective wafer W is passed between the external transfer arm 10 and the concave portion 24 of the turntable 2, which is a loading portion, at a place facing the transfer port 15.

Figure 6:
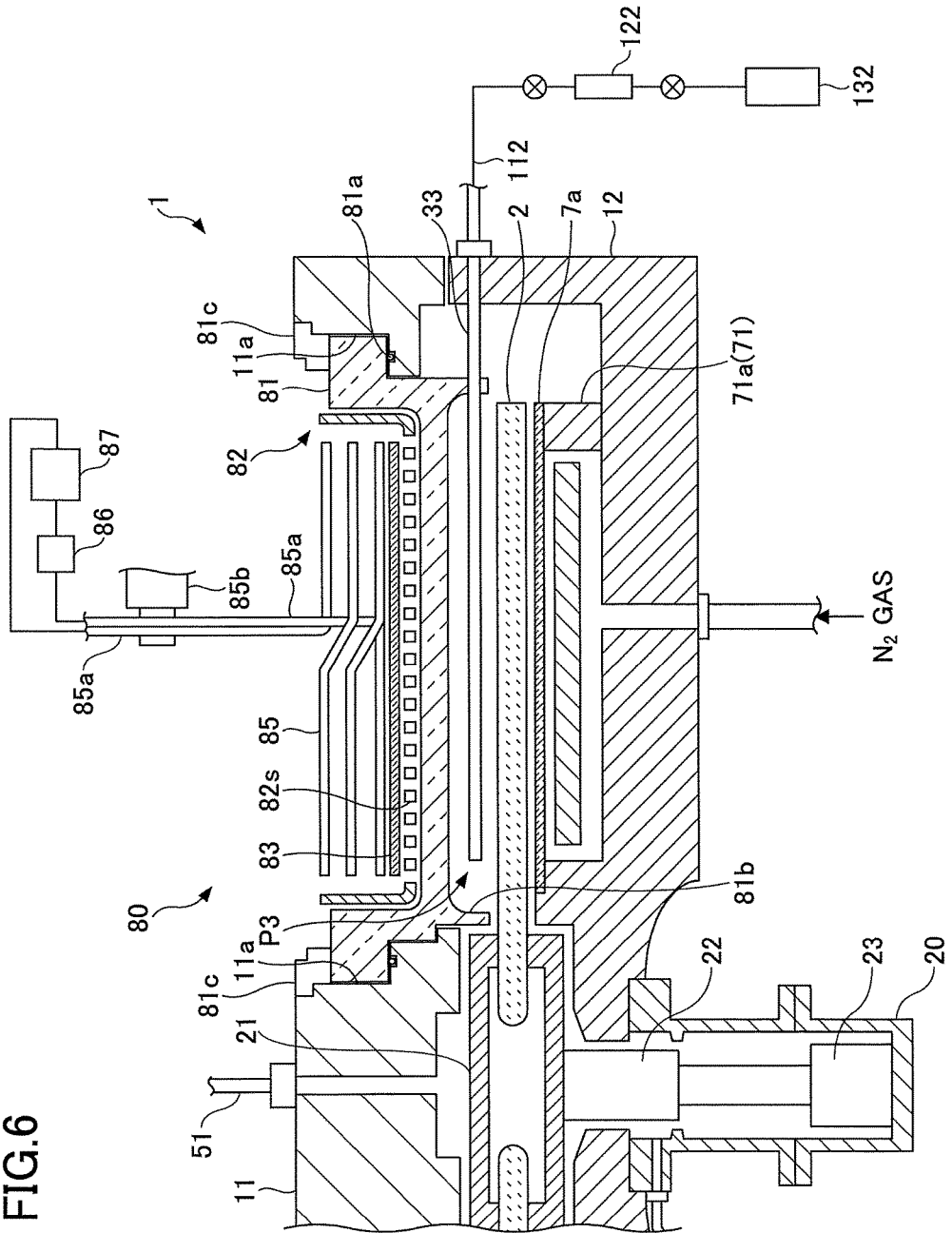
FIG. 6 is a schematic cross-sectional view of a plasma generator provided in the film deposition apparatus illustrated in FIG. 1.
Figure 7:
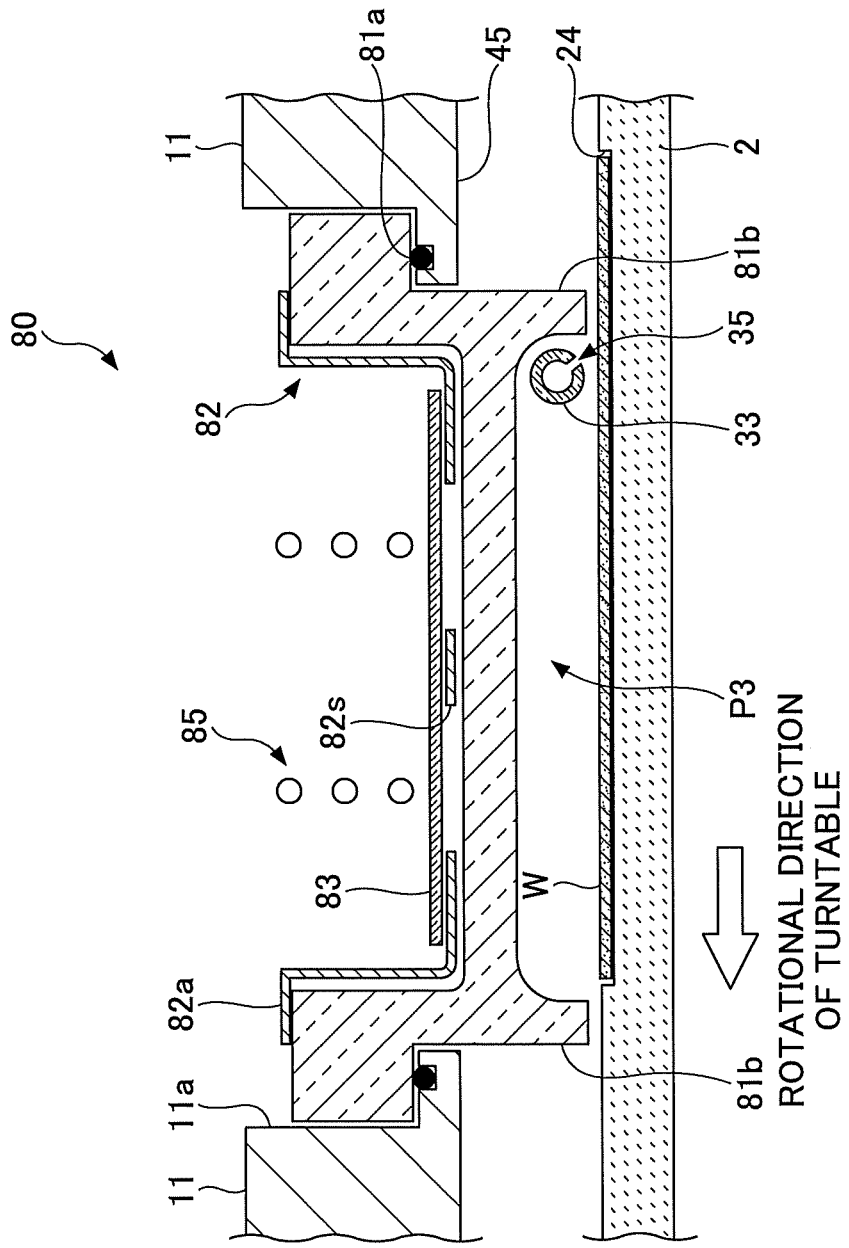
FIG. 7 is another schematic cross-sectional view of a plasma generator provided in the film deposition apparatus illustrated in FIG. 1.
Figure 8:
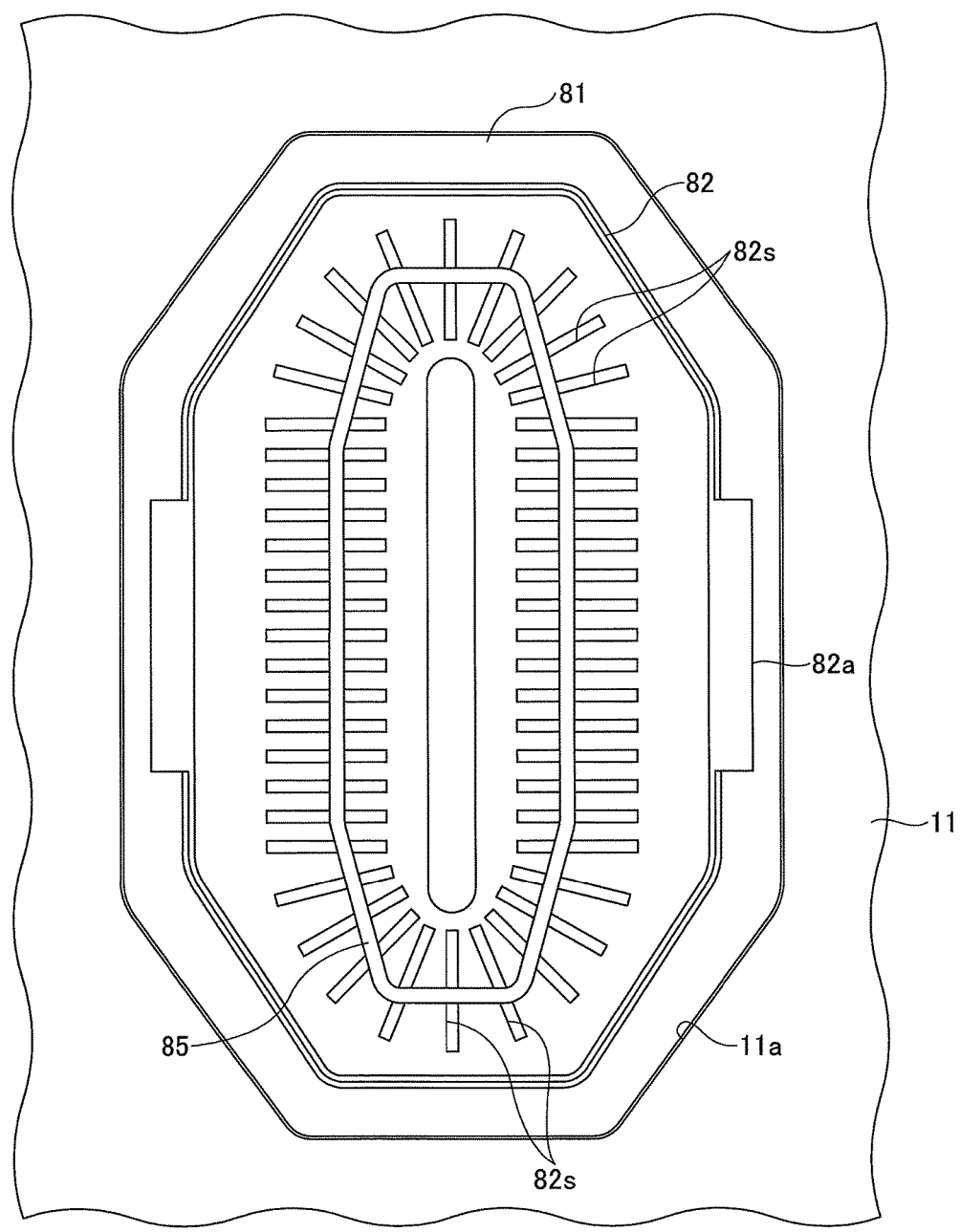
FIG. 8 is a schematic top view illustrating a plasma generator provided in the film deposition apparatus illustrated in FIG. 1.

Next, a plasma generator 80 provided as necessary is explained with reference to FIG. 6 to FIG. 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are simplified or omitted in the drawings.

Referring to FIG. 6, the plasma generator 80 is made of a material which transmits radio frequency waves, and has a concave portion in its upper surface. The plasma generator 80 further includes a frame member 81 which is embedded in an opening 11a provided in the ceiling plate 11, a Faraday shield plate 82 housed in the concave portion of the frame member 81 and having substantially a box-like shape whose top is opened, an insulating plate 83 placed on a bottom surface of the Faraday shield plate 82, and a coil antenna 85 supported on the insulating plate 83. The antenna 85 has substantially an octagonal planar shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions which correspond to the step portions of the opening 11a, and when the frame member 81 engages with the opening 11a, a back side surface of one of the step portions contacts the sealing member 81a embedded in the groove of the opening 11a so that the ceiling plate 11 and the frame member 81 are kept in an air-tight manner. Further, as illustrated in FIG. 6, a pushing member 81c, which extends along the outer periphery of the frame member 8 which is embedded in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b which projects downward (toward the turntable 2) is provided at the perimeter at the lower surface. The lower surface of the projection portion 81b is block to the surface of the turntable 2, and a space (hereinafter referred to as a third process region P3) is formed by being surrounded by the projection portion 81b, the surface of the turntable 2 and the lower surface of the frame member 81 above the turntable 2. The space between the lower surface of the projection portion 81b and the surface of the turntable 2 may be approximately the same as the height h1 of the ceiling surface 44 from the upper surface of the turntable 2 in the separation space H (FIG. 4).

Further, the reaction gas nozzle 33 which penetrates the projection portion 81b is provided in the third process region P3. In this embodiment, as illustrated in FIG. 6, an etching gas supplying source 132 filled with an etching gas is connected to the reaction gas nozzle 33 by the pipe 112 through the flow controller 122. Although not illustrated, a noble gas such as Ar may be mixed with the etching gas. In this case, the etching gas and the noble gas are mixed with each other at predetermined flow rates, and the mixed gas is converted to plasma and supplied to the third process region P3.

As illustrated in FIG. 7, the reaction gas nozzle 33 has a plurality of gas discharge holes 35 formed along the longitudinal direction thereof at predetermined intervals (10 mm, for example) so that the etching gas is discharged from the gas discharge holes 35. As illustrated in FIG. 7, the gas discharge holes 35 are inclined from a vertical direction with respect to the turntable 2 toward the upstream rotation direction of the turntable 2. Thus, the gas supplied from the reaction gas nozzle 33 is discharged in a direction opposite to the rotation direction of the turntable 2, specifically, toward a space between a lower surface of the projection portion 81b and the surface of the turntable 2. Thus, the flows of the reaction gas and the separation gas from a space below the ceiling surface 45 which is upstream of the plasma generator 80 toward the third process region P3 along the rotation direction of the turntable 2 can be prevented. Further, as described above, as the projection portion 81b which is formed along an outer periphery of the lower surface of the frame member 81 is close to the surface of the turntable 2, the pressure in the third process region P3 can be readily kept high by the gas from the reaction gas nozzle 33. In the protective film forming method according to the embodiment, because the supply of the source gas from the reaction gas nozzle 31 and the oxidation gas from the reaction gas nozzle 32 are stopped when performing the etching process, these gases are unlikely to flow into the third process region P3. Besides, even if the oxidation gas remains in the reaction gas nozzle 32 and the separation gas continues to be supplied during the etching, the remaining oxidation gas and the inflow of the separation gas continuously supplied during the etching can be reliably prevented due to the high pressure in the third process region P3.

Thus, the frame member 81 plays a role of separating the third process region P3 from the surroundings. Hence, although the film deposition apparatus according to the embodiment of the present invention does not have to include the whole of the plasma generator 80, the film deposition apparatus preferably includes the frame member 81 to separate the third process region P3 from the second process region P2 and to prevent the second reaction gas (oxidation gas) from flowing into the third process region P3.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s extends substantially perpendicular to the corresponding lines of the antenna 85 which has the substantially octagonal planar shape.

As illustrated in FIG. 7 and FIG. 8, the Faraday shield plate 82 includes two support portions 82a which are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency wave radiated from the antenna 85.

The antenna 85 is formed by winding a pipe made of copper three times, for example, in a substantially octagonal planar shape. This structure allows cooling water to circulate in the pipe, thereby preventing the antenna 85 from being heated to a high temperature by the radio frequency wave supplied to the antenna 85. As illustrated in FIG. 6, the antenna 85 includes a standing portion 85a to which a support portion 85b is attached. The support portion 85b holds the antenna 85 at a predetermined position in the Faraday shield plate 82. The radio frequency power source 87 is connected to the support portion 85b via a matching box 86. The radio frequency power source 87 can generate radio frequency power of 13.56 MHz, for example.

The plasma generator 80 having such a structure, when the radio frequency power source 87 supplies the radio frequency power to the antenna 85 via the matching box 86, generates the electromagnetic field by the antenna 85. In the electromagnetic field, the Faraday shield plate 82 blocks the electric field component, which cannot travel downward. On the other hand, the magnetic field component travels downward into the third process region P3 through the plurality of slits 82s of the Faraday shield plate 82. The magnetic field component activates the etching gas supplied from the reaction gas nozzle 33 to the third process region P3 at a predetermined flow rate ratio.

As illustrated in FIG. 1, the film deposition apparatus of the embodiment further includes a controller 100 which controls the entirety of the film deposition apparatus. The controller 100 may be a computer. The controller 100 stores a program in its memory to cause the film deposition apparatus to execute the protective film forming method (as will be explained later) under control of the controller 100. The program is configured to include steps capable of executing the protective film forming method, and is stored in a recording medium 102 such as a hard disk, a compact disk (CD), a magneto-optic disk, a memory card, a flexible disk, or the like. The program is read into a memory unit 101 by a predetermined reading device and is installed in the controller 100.

The controller 100 may control the rotational speed of the turntable 2. Thus, the rotational speed of the turntable 2 can be set at the high speed such as 120 rpm or higher or in the range of 120 to 300 rpm as discussed above, or at the low speed such as 60 rpm.

The controller 100 may also control the flow rate controller 121 to 123. Thus, the flow rate of each of the gases supplied from the reaction gas nozzles 31 through 33 can be controlled. In the upward growth process and the sacrificial film forming process described later, how the protective film is deposited, that is, the three dimensional shape of the protective film, is varied by changing the rotational speed of the turntable 2 and the flow rate of the source gas while supplying the same source gas and the oxidation gas. The controller 100 may perform such control.

Protective Film Forming Method

First Embodiment

Next, a protective film forming method according to a first embodiment of the present invention is described below by citing an example of using the above-mentioned film deposition apparatus. The protective film forming method according to the embodiment comprises an upward growth process of depositing a protective film on a flat surface region between multiple recessed shapes formed in a surface of a wafer W such as trenches to make the protective film grow upward, and an etching process of removing lateral portions of an unnecessary film that has grown even in a lateral direction.

To begin with, the upward growth process is described below with reference to FIGS. 9A through 9F. FIGS. 9A through 9F are diagrams for describing an example of the upward growth process of the protective film forming method according to the embodiment of the present invention.

Figure 9A:
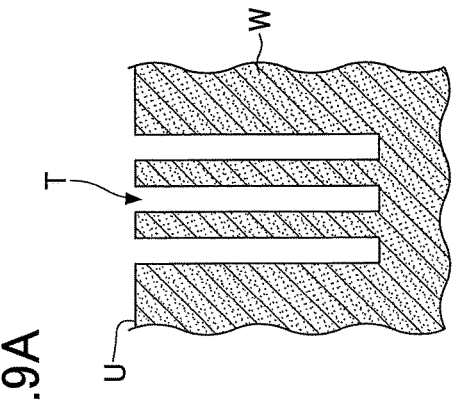
FIGS. 9A through 9F are diagrams for describing an example of an upward growth process of a protective film forming method according to an embodiment of the present invention.

FIG. 9A is a diagram illustrating an example of a surface pattern of a wafer W used in the protective film forming method of the embodiment. In the present embodiment, a silicon wafer is used as the wafer W, and a plurality of trenches T is formed in the silicon wafer, as illustrated in FIG. 9A. Moreover, the protective film forming method according to the present embodiment is described below by citing an example of supplying an organic titanium gas from the reaction gas nozzle 31 and supplying $H_2O_2$ gas as the oxidation gas from the reaction gas nozzle 32. An example of using $CF_4$ as the etching gas is described below, but in the upward growth process, the etching gas is not supplied from the reaction gas nozzle 33, and the supply of any gas from the reaction gas nozzle 33 is stopped.

First, a gate valve (not illustrated in the drawings) is opened and the wafer W is passed to the concave portion 24 of the turntable 2 via the transfer port 15 (FIG. 2 and FIG. 3) by the transfer arm 10 (FIG. 3) from outside. This operation is performed by lifting the lift pins (not illustrated in the drawings) via through holes provided at a bottom surface of the concave portion 24 from the bottom portion side of the vacuum chamber 1 when the concave portion 24 stops at a position facing the transfer port 15. By repeating this operation while intermittently rotating the turntable 2, the respective wafers W are placed on the concave portions 24.

Then, the gate valve is closed, and the vacuum pump 640 evacuates the vacuum chamber 1 up to the minimum vacuum level. Then, $N_2$ gas is discharged from the separation gas nozzles 41 and 42 as the separation gas at a predetermined flow rate. At this time, $N_2$ gas is also discharged from the separation gas supplying pipe 51 and the purge gas supplying pipes 72 and 73 at predetermined flow rates, respectively. Thus, the vacuum chamber 1 is adjusted to a predetermined set pressure by the pressure controller 650 (FIG. 1). Then, the wafers W are heated to 150° C., for example, by the heater unit 7 while rotating the turntable 2 in a clockwise direction at a rotational speed of 120 rpm or higher, for example. Here, an example of setting the rotational speed of the turntable 2 at 240 rpm is described below.

Subsequently, the reaction gas nozzle 31 (FIG. 2 and FIG. 3) supplies the organic titanium gas, and the reaction gas nozzle 32 supplies $H_2O_2$ gas while activating $H_2O_2$ gas by heat. The organic titanium gas is produced by vaporizing an organic titanium compound by vaporizer and is supplied together with a carrier gas of Ar. $H_2O_2$ may be supplied with a carrier gas of $O_2$.

Figure 9B:
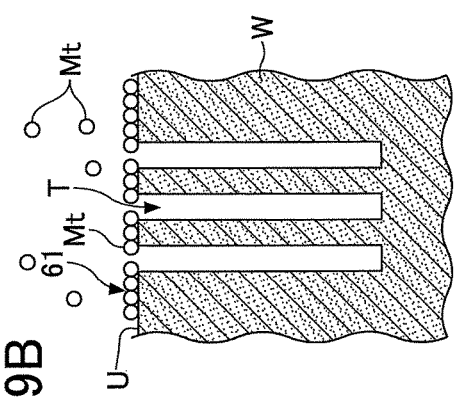

FIG. 9B is a diagram illustrating an example of a source gas adsorption process. The wafers W repeatedly pass through the first process region P1, the separation region D, the second process region P2, the third process region P3, and the separation region D in this order by rotation of the turntable 2 (see FIG. 3). As illustrated in FIG. 9B, molecules Mt of the organic titanium compound adsorb on the surface of the wafers W, and a molecular layer 61 of the organic titanium compound is formed. Here, the molecules Mt of the organic titanium gas are one of organometallic gases, and contain a metal of titanium surrounded by organic groups attached thereto. The diameters of the molecules Mt are large. Moreover, the molecules Mt of the organic titanium do not reach deep portions of the trenches T, and adsorb on the surfaces U of the wafers W.

Figure 9C:
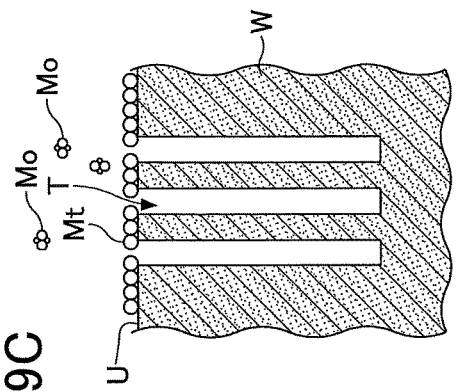
Figure 9D:
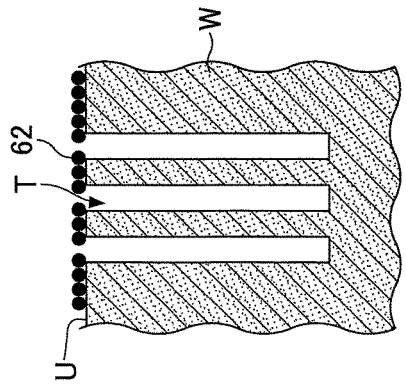

FIGS. 9C and 9D are diagrams illustrating an example of an oxidation process. As illustrated in FIG. 9C, the organic titanium gas adsorbed on the surfaces U of the wafer W is oxidized by the $H_2O_2$ molecules Mo in the second process region P2 after passing through the separation region D, and as illustrated in FIG. 9D, protective films 62 made of titanium oxide ($TiO_2$) are deposited on the surfaces U of the wafer W at the upper end of the trenches T.

Figure 9E:
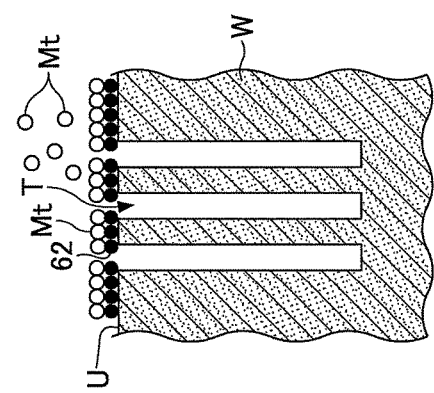

FIG. 9E is a diagram illustrating an example of a source gas adsorption process repeated again. As illustrated in FIG. 9E, when the wafer W reaches the first process region P1 by the rotation of the turntable 2 again, the molecules Mt of the organic titanium gas supplied from the reaction gas nozzle 31 adsorb on the surfaces U of the wafer W. Here, because the diameters of the molecules Mt of the organic titanium gas are relatively great since the organic groups are attached to titanium and because the turntable 2 rotates at high speed, the molecules Mt of the organic titanium do not reach the deep portions of the trenches T and adsorb only on the top surfaces and their surroundings of the wafer W.

Hereinafter, while the turntable 2 rotates at high speed, the same process is repeated, thereby depositing the $TiO_2$ film on the surfaces U of the wafer W and forming the protective films 62.

Figure 9F:
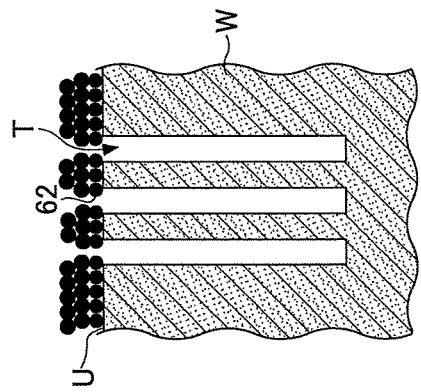

FIG. 9F is a diagram illustrating an example of the $TiO_2$ film that has grown upward on the surface U of the wafer W. By repeating the processes described in FIGS. 9B through 9E (more accurately the processes from FIGS. 9C through 9E), the protective film 62 grows upward and the film thickness of the $TiO_2$ film increases. Thus, by supplying the organic metal gas having large molecule diameters as the source gas from the reaction gas nozzle 31 while rotating the turntable 2 at a high speed of 120 rpm or higher, the regional protective film 62 can be selectively formed only on the regions between the trenches T without developing the film deposition in the trenches T. In the present embodiment, the example of using the organic titanium gas as the source gas has been described, but because organometallic gases generally have large molecular diameters, the protective film forming method according to the present embodiment can be performed by using another type of organometallic gas. Moreover, the protective film forming method according to the present embodiment can be performed not only by using the organometallic gas but also by using organic metalloid gases such as an organic silane gas due to their large molecular diameters.

Because the organometallic gas and the organic metalloid gas generally have large molecular diameters, the protective film forming method of the present embodiment can be performed even when another organometallic gas or organic metalloid gas is used. For example, organometallic gases used for depositing a high dielectric film (high-k film) such as tris(dimethylamino)cyclopentadienylzirconium ($C_{11}H_{23}N_3Zr$) may be used. In addition, an organometallic gas or an organic metalloid gas obtained by vaporizing a metal such as aluminum, hafnium or titanium or a metalloid such as silane may be used as the source gas.

In general, organometallic compounds used as the source gas for depositing high-k films contain an amine and an amino group (—$NH_2$, —NHR, —NHR'). For example, when an organometallic gas reacts with an oxidation gas and thereby is oxidized, the oxidized organometallic gas releases an amino group, which discharges a harmful gas. In the protective film forming method and the film deposition apparatus according to the present embodiment, the amino group is sufficiently oxidized, and the harmful gas is rendered harmless, which is described later. The source gas is not limited to the above-mentioned gases, and a variety gases may be used.

FIG. 10 is a table illustrating examples of the source gas applicable to the protective film forming method according to the first embodiment of the present invention. Thus, the protective film can be formed by using various organometallic gases and organic metalloid gases. Here, FIG. 10 illustrates only examples, and the protective film forming method according to the present embodiment can be performed by using another organometallic gas or organic metalloid gas.

Figure 11C:
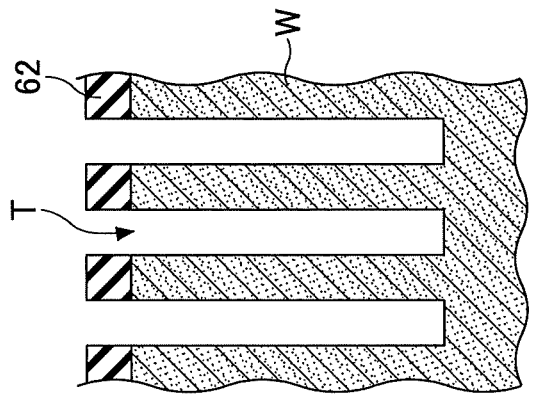
FIGS. 11A through 11C are diagrams illustrating an example of a series of processes in an etching process of the protective film forming method according to an embodiment.
Figure 11B:
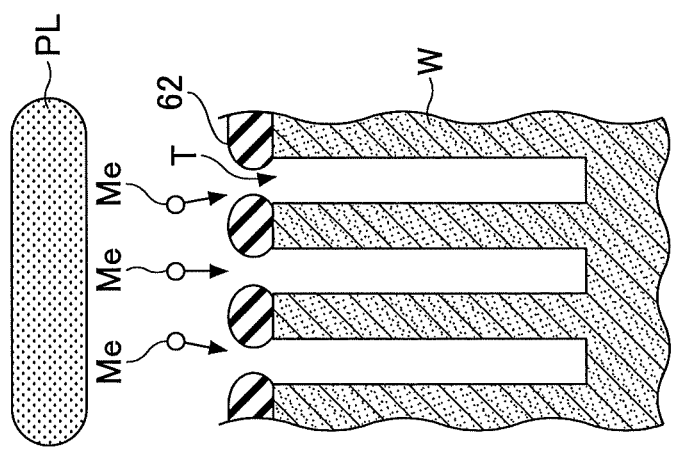
Figure 11A:
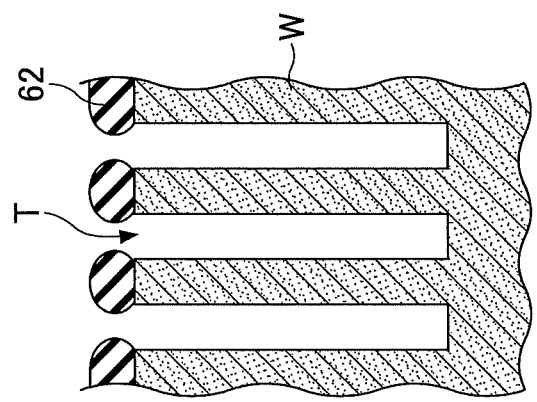

FIGS. 11A through 11C are diagrams illustrating a series of processes of an etching process of the protective film forming method according to the present embodiment.

FIG. 11A is a diagram illustrating an example of the protective films 62 when starting the etching process. By repeating a cycle of the source gas adsorption process and the oxidation process in the upward growth process, the protective films 62 grow upward, but the protective films 62 also grow in the lateral direction (horizontal direction), thereby forming shapes likely to block the openings of the trenches T. FIG. 11A illustrates such a state that the protective films 62 begin to block the openings of the trenches T. When the protective films 62 do not reach a predetermined film thickness even in such a state, the etching process is performed.

In the etching process, the supply of the source gas and the oxidation gas is stopped, and the reaction gas nozzle 33 supplies $CF_4$, which is the etching gas. The turntable 2 is successively rotated and the separation gas nozzles 41 and 42 supply the separation gas.

FIG. 11B is a diagram illustrating an example of the etching process. In the etching process, plasma PL activates molecules Me of the etching gas, and the activated etching gas etches lateral portions of the protective films 62 and removes the unnecessary protective films 62 that has laterally grown. The plasma PL is not required, but preferably used when using $CF_4$ as the etching gas. When using a gas with high etching intensity such as $ClF_3$, the plasma PL is unnecessary as discussed above.

The flow rate of the etching gas may be set at a low value, and for example, the flow rate of $CF_4$ may be set in a range of about 40 to about 70 sccm, and may be set at 60 sccm, for example. Thus, only unnecessary portions of the protective films 62 can be etched. The rotational speed of the turntable 2 is set lower than that of the upward growth process, in a range of about 60 to about 90 rpm. For example, the rotational speed of the turntable 2 may set at 75 rpm, for example. By doing such adjustment, the lateral portions of the protective films 62 can be efficiently etched. Here, the upper portions of the protective films 62 are also etched, but the protective films 62 have round shapes as a whole, and the upper portions can be etched into flat shapes. Here, because the rotational speed of the turntable 2 during the etching significantly differs depending on a process, an appropriate speed may be set depending on the process.

FIG. 11C is a diagram illustrating an example of a termination phase of the etching process. The unnecessary lateral portions of the protective films 62 are removed by the etching process, and the remaining protective films 62 can be formed into shapes that have grown nearly vertically upward from the flat surfaces of the wafer W such that the protective films 62 do not block the openings of the trenches T. Here, the upper portions of the protective films 62 are etched to some degree, and can be formed into the approximately flat surfaces.

Thus, by performing the etching process after performing the upward growth process, the shapes of the protective films 62 can be adjusted. After that, by repeating the cycle of performing the upward growth process described in FIG. 9A through 9F again and performing the etching process when the protective films 62 grow not only upward but also laterally, thick protective films 62 that have grown only upward can be formed, thereby responding to a variety of process requests.

Figure 12:
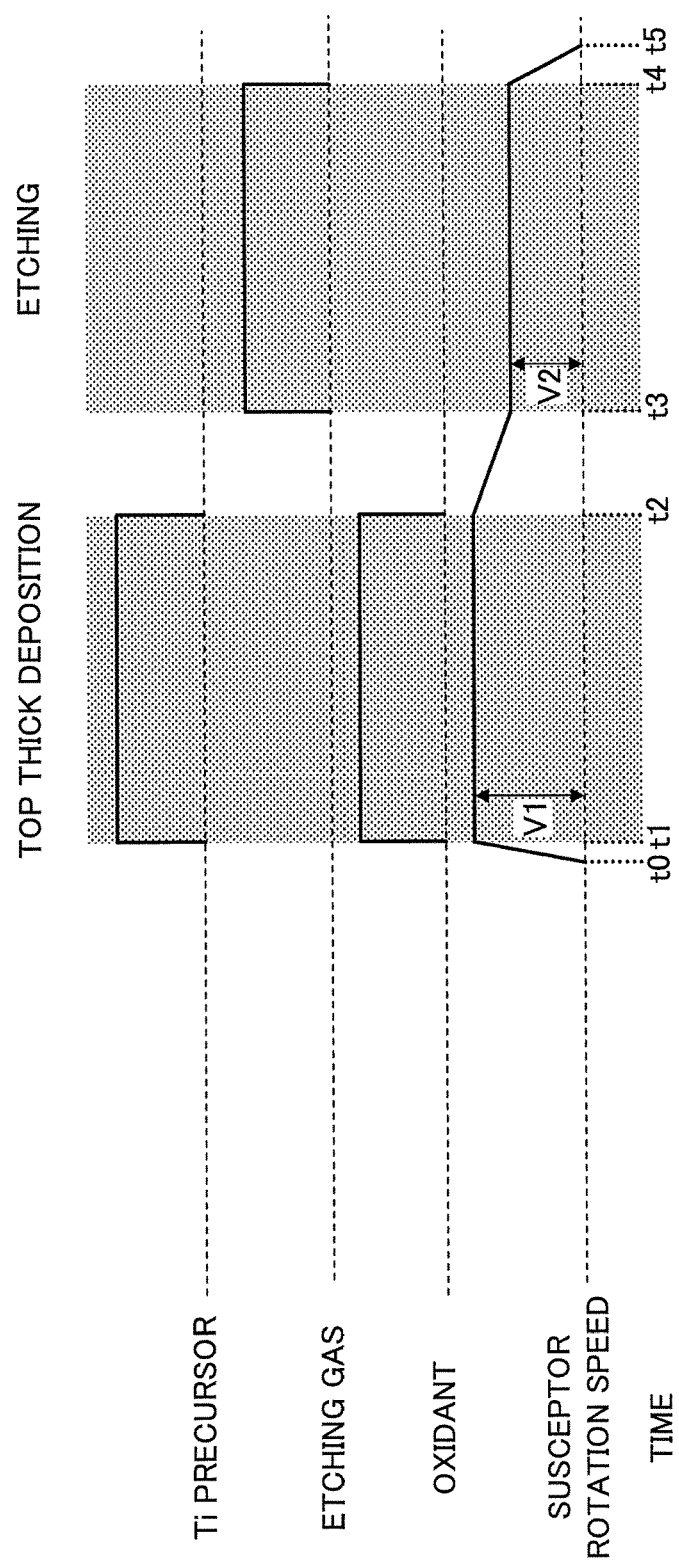
FIG. 12 is a sequence diagram illustrating an example of a protective film forming method according to an embodiment.

FIG. 12 is a sequence diagram of an example of the protective film forming method according to the first embodiment described in FIGS. 9A through 9F and 11A through 11C. In FIG. 12, the horizontal axis is a temporal axis, and shows temporal changes of the source gas (Ti precursor), the etching gas, the oxidation gas, and the rotational speed of the turntable 2. Here, with respect to each of the source gas, the etching gas and the oxidation gas, FIG. 12 shows only whether the gases are supplied or not. In contrast, with respect to the rotational speed of the turntable 2 (susceptor), FIG. 12 shows not only whether the turntable 2 rotates or not but also the change of the rotational speed value.

The turntable 2 starts its rotation at time t0. More specifically, after loading all of the wafers W in the concave portions 24 of the turntable 2, the turntable 2 is rotated.

At time t1, the supply of the source gas and the oxidation gas starts. At this time, the etching gas is not supplied yet. The rotational speed is set at V1, for example, at 240 rpm. This state is maintained from time t1 to time t2. The period from time t1 to time t2 corresponds to the upward growth process.

At time t2, the supply of the source gas and the oxidation gas is stopped, and the upward growth process ends. After that, the setting of the rotational speed of the turntable 2 is changed from V1 to V2, for example, to 75 rpm.

At time t3, the etching process starts. More specifically, the supply of the etching gas starts while the source gas and the oxidation gas are not supplied, and the etching process continues to time t4. Thus, the shape of the protective film 62 is fixed, and goes into a state of not blocking the opening of the trench T.

At time t5, the rotation of the turntable 2 is stopped, but the upward growth process and the etching process may be repeated more. In other words, by repeating a single cycle constituted of the upward growth process and the etching process a plurality of cycles, the protective film 62 can be deposited to a predetermined thickness.

Thus, according to the protective film forming method according to the first embodiment, the protective film 62 can be deposited up to the predetermined thickness while fixing the side surface of the protective film 62 into a shape having approximately vertical side surface.

Second Embodiment

Figure 13:
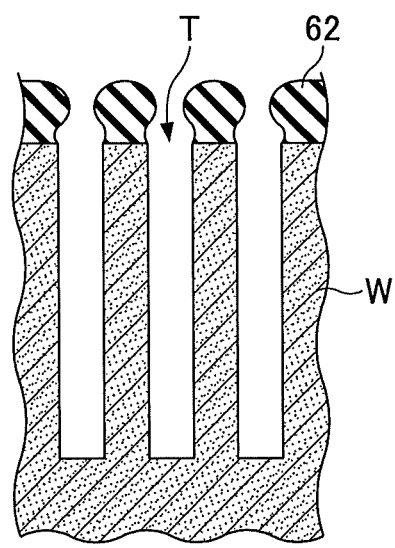
FIG. 13 is a diagram illustrating a protective film when etching is performed excessively in a protective film forming method according to an embodiment.

FIG. 13 is a diagram illustrating protective films 62 when the etching becomes too intense in the protective film forming method according to the first embodiment. In many cases, the protective films 62 that have grown only upward can be formed by the protective film forming method according to the first embodiment, but sometimes, the protective films 62 are regionally etched excessively because of too intense etching depending on conditions such as shapes of trenches T including aspect ratios, a type of the protective films 62, a required film thickness and a type of etching gas. This appears to be caused by an increase of a remaining rate of the etching gas around the upper ends of the trenches T because the etching gas is reflected from the bottom surfaces of the trenches T and flows back upward in the etching.

In such a case, before the upward growth process, by performing a process of forming a sacrificial film conformal to the surface shape of the wafer W including surface shapes of the protective films 62 and by preliminarily forming the sacrificial film for the etching process, the protective films 62 that grow up only upward along the lateral shapes of the trenches T can be formed.

FIGS. 14A through 14C are diagrams illustrating an example of a sacrificial film forming process of the protective film forming method according to the second embodiment.

FIG. 14A is a diagram illustrating an example of the sacrificial film forming process. To begin with, a sacrificial film 60 conformal to the surface of the wafer W is formed on the surface of the wafer W. In this case, the sacrificial film 60 is preferably the same kind of film as that of the protective film 62 because a non-etched portion of the sacrificial film 60 remains. In other words, when the $TiO_2$ film described in the first embodiment is used as the protective film 62, the $TiO_2$ film is preferably also used as the sacrificial film 60.

The sacrificial film 60 just has to be formed thin as long as the sacrificial film 60 covers the entire region. For example, the sacrificial film 60 may be deposited to have a thickness in a range of about 1 to about 20 nm. To deposit such a film, the film deposition is performed by increasing the flow rate of the source gas and decreasing the rotational speed of the turntable 2 because the source gas needs to be caused to reach deep portions of the trenches T. The rotational speed of the turntable 2 can be set at a proper value in a range that is slower than the value in the upward growth process, and can be set at a variety of values depending on the intended use as long as the rotational speed is slower than 120 rpm. For example, when the flow rate of Ar that is the carrier gas of TDMAT, which is the source gas, is set at 100 sccm in the upward growth process, and when the rotational speed of the turntable 2 is set at 240 rpm in the upward growth process, the flow rate of Ar that is the carrier gas of TDMAT is set at 300 sccm, which is three times as high as the flow rate in the upward growth process, and the rotational speed of the turntable 2 is set at 60 rpm, which is one fourth of the rotational speed of the turntable 2 in the upward growth process. By performing the film deposition under such conditions, a conformal film along the surface shape of the wafer W can be formed even if the same kind of source gas is used. The flow rate of the carrier gas of TDMAT substantially shows the flow rate of TDMAT. For example, the flow rate of the source gas in the sacrificial film forming process may be set 1.5 to ten times as high as the flow rate in the upward growth process, and is preferably set two to six times as high as the flow rate in the upward growth process, and is further preferably set two to four times as high as the flow rate in the upward growth process. Moreover, the rotational speed of the turntable 2 may be set at one second to one tenth of the rotational speed in the upward growth process, and is preferably set at one third to one fifth of the rotational speed in the upward growth process.

FIG. 14B is a diagram illustrating an example of the upward growth process. In the upward growth process, the protective film 62 is formed on the sacrificial film 60 by the same method as that of the first embodiment.

FIG. 14C is a diagram illustrating an example of the etching process. In the etching process, although the etching gas remains a lot around the upper ends of the trenches T when the sacrificial films 60 are not present in the etching process, because the sacrificial films 60 are formed on the surfaces of the trenches T, the etching gas is consumed to etch the sacrificial films 60 in the trenches T and does not concentrate around the upper ends of the trenches T. Thus, the etching is made uniform, and the side surfaces of the protective films 62 can be formed into shapes along the side surfaces of the trenches T.

Thus, in a process that is likely to cause regionally intense etching, the sacrificial film forming process is performed before the upward growth process, and the sacrificial films 60 are formed. By doing this, the regional and uneven etching can be prevented, and the protective film 62 that has approximately vertical side walls and has grown upward can be formed.

Here, after FIG. 14C, when the protective films 62 are further made grow upward, by performing the sacrificial film forming process before performing the upward growth process and forming the conformal sacrificial films 60 on the inner walls of the trenches T and on the side surfaces and the upper surfaces of the already formed protective films 62, the protective films 62 can be made grow upward while fixing the shape of the protective films 62 even if the film thickness of the protective films 62 is further made thick.

Figure 15:
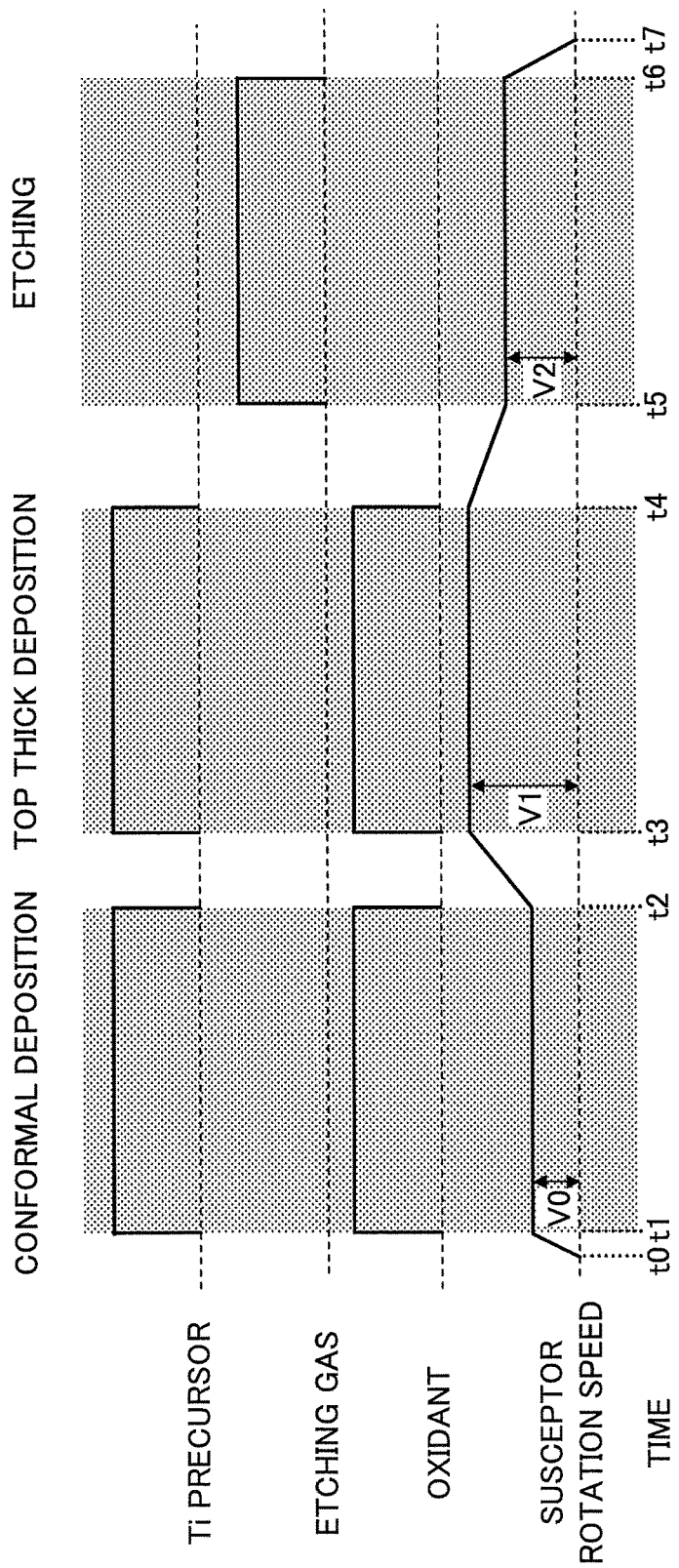
FIG. 15 is a sequence diagram illustrating an example of a protective film forming method according to an embodiment.

FIG. 15 is a sequence diagram of an example of the protective film forming method according to the second embodiment. The horizontal axis shows time, and the items provided along the vertical axis are the same as those of FIG. 12.

At time t0, the turntable (susceptor) 2 holding the wafers W starts rotating.

At time t1, when the rotational speed of the turntable 2 reaches a setting speed V0, the sacrificial film forming process is started. More specifically, the supply of TDMAT that is the source gas starts, and the supply of the oxidation gas also starts. The supply of the etching gas is stopped.

The rotational speed V0 of the turntable 2 in the sacrificial film forming process is set at a value lower than a rotational speed V1 in the upward growth process that starts from time t3. The rotational speed of the turntable 2 may be, for example, in a range of 0.5 to 80 rpm, and may be set at 60 rpm, for example.

Moreover, the flow rate of the source gas is, for example, set two to six times as high as the flow rate in the upward growth process, and may be set about three times as high as the flow rate in the upward growth process, for example.

At time t2, the supply of the source gas and the oxidation gas ends, and the sacrificial film forming process ends. As discussed above, because the sacrificial film 60 is formed to consume the excessive etching gas and make distribution of the etching gas uniform, the sacrificial film 60 just has to be formed thin as a whole, for example, at a thickness in a range of 1 to 5 nm.

At time t3 to t6, the same upward growth process and etching process as those of the first embodiment are performed. In the etching process, the etching gas is consumed by the sacrificial films 60 on the inner walls of the trenches T, and the sacrificial films 60 on the side surfaces and the upper surfaces of the protective films 62 when the protective films 62 are already deposited, thereby preventing the etching gas from concentrating around the upper ends of the trenches T and preventing the regional excessive etching. Thus, the protective films 62 having the side surfaces extending along the side walls of the trenches T can be formed.

At time t7 in FIG. 15, although the rotational speed of the turntable 2 decreases to zero, the rotational speed of the turntable 2 may be decreased only to V0, and the protective films 62 may be formed up to a predetermined film thickness by performing the sacrificial film forming process again. In other words, time t1 to t7 in FIG. 15 is made one cycle, and a plurality of cycles may be repeated until the protective films 62 reach the predetermined film thickness.

Thus, the protective film forming method of the second embodiment can prevent the regional excessive etching and make the protective films 62 having the vertical side surfaces along the side walls of the trenches T grow upward, thereby forming the thick protective films 62 having preferable shapes.

Moreover, in the second embodiment, the kind of source gas of the sacrificial film forming process is made the same as that of the upward growth process, but forming a different kind of protective films 60 from a kind of protective films 62 formed in the upward growth process is possible. However, when the kind of gases increases, the processes become complicated, and besides, the $TiO_2$ film contains a different component. Hence, the same kind of film is preferably used in the sacrificial film 60 and the protective film 62.

Here, the rotational speed of the turntable 2 is set in a range of 120 to 300 rpm in the upward growth process, but the rotational speed also depends on the kind of source gas. For example, when forming the protective film 62 of $TiO_2$ using TDMAT, the rotational speed of the turntable 2 is preferably set in a range of 200 to 280 rpm, and is further preferably set in a range of 220 to 260 rpm. For example, as described in the embodiment, the rotational speed of the turntable 2 may be set at 240 rpm.

Moreover, when the organic metalloid gas such as an organic silane gas is used as the source gas, the rotational speed of the turntable 2 in the upward growth process is preferably set faster than the rotational speed when the organometallic gas is used as the source gas. For example, when the organic metalloid gas such as the organic silane gas is used as the source gas, the rotational speed of the turntable 2 is preferably set in a range of 150 to 300 rpm, and is further preferably set in a range of 200 to 300 rpm.

The rotational speed of the turntable 2 may be set to an appropriate value depending on the kind of source gas, the shape of trenches T formed in the surface of the wafer W, and an opening width of the trenches T or holes in a range of 120 rpm or higher. At present, because the mechanical limits of the rotational speed of the turntable 2 is 300 rpm, the method is described as setting the upper limit to 300 rpm. However, if the turntable 2 can be rotated at a speed higher than 300 rpm such as 400 rpm or 500 rpm, the rotational speed of the turntable 2 can be set at a speed higher than 300 rpm.

In addition, the pattern formed in the surface of the wafer W may be a pattern with a plurality of holes or a pattern with a trench T and a hole together, and the protective film 62 can be formed on any flat surface region between the recessed shapes.

In the above embodiments, an example of performing the thermal oxidation process in the oxidation process and then performing the plasma etching process has been described, but a plasma oxidation process may be performed instead of the thermal oxidation process, and the plasma may not be necessarily used in the etching process, as discussed above. A variety of methods and apparatuses can be used as the oxidation and etching method and apparatus depending on the intended use.

Thus, there are various options depending on the intended use with respect to the oxidation process and the etching process.

Furthermore, the first and second embodiments have described an example of the protective film forming method by the film deposition apparatus using the turntable 2, but the protective film forming method according to the present embodiments can be performed without using the turntable 2 if the supply of different kinds of gases can be switched at high speed. In this case, because a series of processes is performed one time every time the turntable 2 rotates, the series of the source gas adsorption process, the oxidation process, the plasma process, the purge process performed between the source gas adsorption process and the oxidation process, and the purge gas process performed between the plasma process and the source gas adsorption process, is performed one time, respectively, every rotation of the turntable 2. The rotational speed of the turntable 2 can be converted to a number of cycles. That is, when the rotational speed of the turntable 2 is set at 120 rpm, 120 cycles should be performed per one minute. Similarly, when the rotational speed of the turntable 2 is set at 60 rpm, 60 cycles should be performed per one minute, and when the rotational speed of the turntable 2 is set at 75 rpm, each process should be performed 75 times per minute.

For example, the protective film forming method of the embodiments can be applied to the film deposition apparatus that includes a process chamber without any partition, and a susceptor to support a single wafer thereon provided in the process chamber. The film deposition apparatus performs film deposition by switching kinds of gases supplied into the process chamber while rotating the susceptor or without rotating the susceptor. Even in this case, by repeating a cycle of the upward growth process and the etching process, and further the sacrificial film forming process as necessary a plurality of number of times, while switching the kinds of gases supplied into the process chamber in the cycle of the present embodiments, the protective films 62 can be formed on the wafer W similarly to the present embodiments.

Moreover, the protective film forming method according to the present embodiments can be applied to a so-called vertical heat treatment apparatus that accommodates a wafer holding member called a wafer boat that holds a plurality of wafers W such as 50 to 100 wafers W stacked in a vertical direction at a predetermined distance from the vertically adjacent wafers W in a process chamber and heats the process chamber while rotating the wafer boat and sequentially switching kinds of gases supplied into the process chamber. Even in this case, although a way of holding the wafers W differs from the above-mentioned film deposition apparatuses, the protective films 62 can be formed by switching the supplied gases.

Such a gas switch can be performed when each film deposition apparatus includes a controller corresponding to the controller 100 of the present embodiments, and the controller performs such gas switching control.

In the present embodiment, because the controller 100 controls the rotation of the turntable 2 and the supply of the gases such as the source gas, the oxidation gas and the etching gas, by causing the controller 100 to control the rotational speed of the turntable 2, and the flow rate and the supply timing of each of the source gas, the oxidation gas, the etching gas and the like in accordance with a process recipe, the protective film forming method of the present embodiments can be performed.

Working Example

Next, working examples in which the protective film forming method according to the embodiments are described below.

Figure 16:
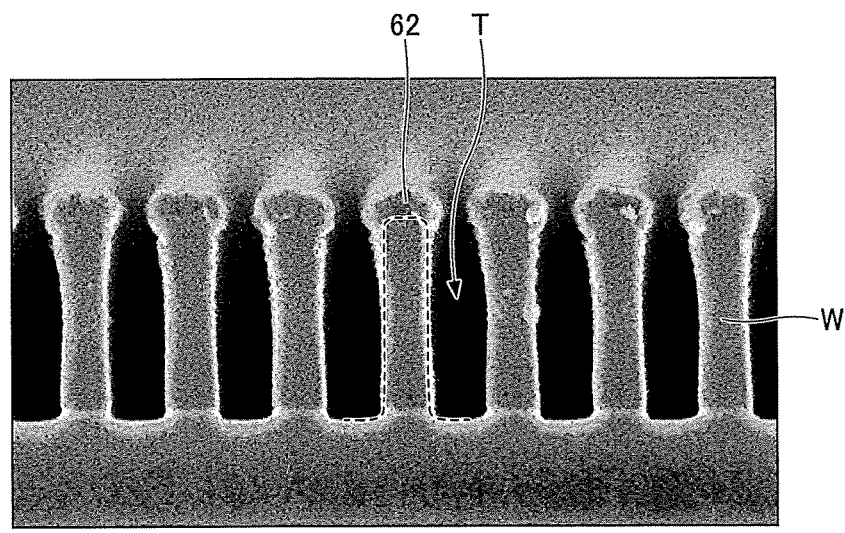
FIG. 16 is a view showing a result of a working example 1 after performing an upward growth process.

FIG. 16 is a view showing a result of a protective film forming method of a working example 1 after performing the upward growth process. In the working example 1, the protective film forming method according to the first embodiment was performed using the above-mentioned turntable type film deposition apparatus. The temperature of the wafer W on the turntable 2 was set at 150° C., and the pressure in the vacuum chamber 1 was set at 1.8 Torr. The rotational speed of the turntable 2 was set at 240 rpm. Moreover, TDMAT was used as the source gas and was supplied by being vapored by a vaporizer, and the flow rate of Ar of the carrier gas was set at 100 sccm. $H_2O_2$ was used as an oxidizing agent and was supplied at a flow rate of 1.65 g/min, and $O_2$ was used as the carrier gas and its flow rate was set at 5000 sccm.

When the upward growth process was performed under such conditions, as shown in FIG. 16, protective films 62 were formed on a flat surface between the adjacent trenches T. The protective films 62 grew thick not only upward but also laterally, and the protective films 62 partially block openings of the trenches T.

Figure 17:
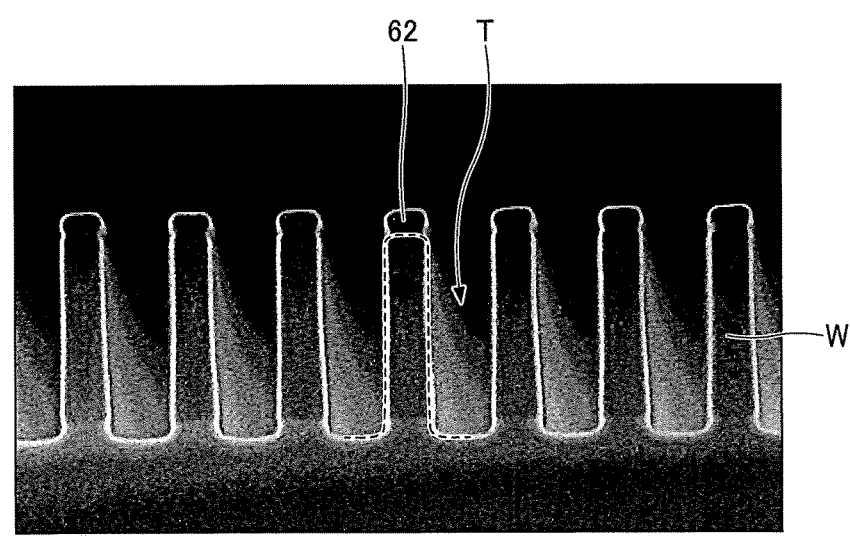
FIG. 17 is a view showing a result of a working example 1 after performing an etching process.

FIG. 17 is a view showing a result of the protective film forming method of the working example 1 after performing the etching process. With respect to the etching conditions, $CF_4$ was used as the etching gas and supplied at a flow rate of 60 sccm with a carrier gas. Ar was used as the carrier gas, and was supplied at a flow rate of 10000 sccm. The output of the plasma generator 80 was set at 2000 W. Also, the rotational speed of the turntable 2 during the etching process was set at 75 rpm.

As shown in FIG. 17, the protective films 62 that have grown upward approximately along the side walls of the trenches are formed on flat surfaces of the wafer W between the trenches T. Thus, the working example 1 has indicated that the protective film forming method according to the first embodiment can form the protective films 62 growing upward approximately vertically along the side walls of the trenches T.

Figure 18A:
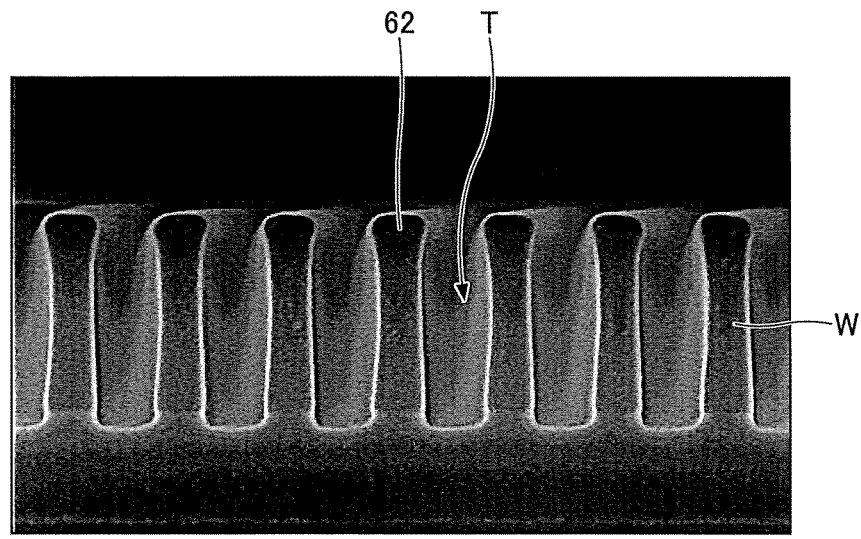
FIGS. 18A and 18B are views showing a result of a working example 2.
Figure 18B:
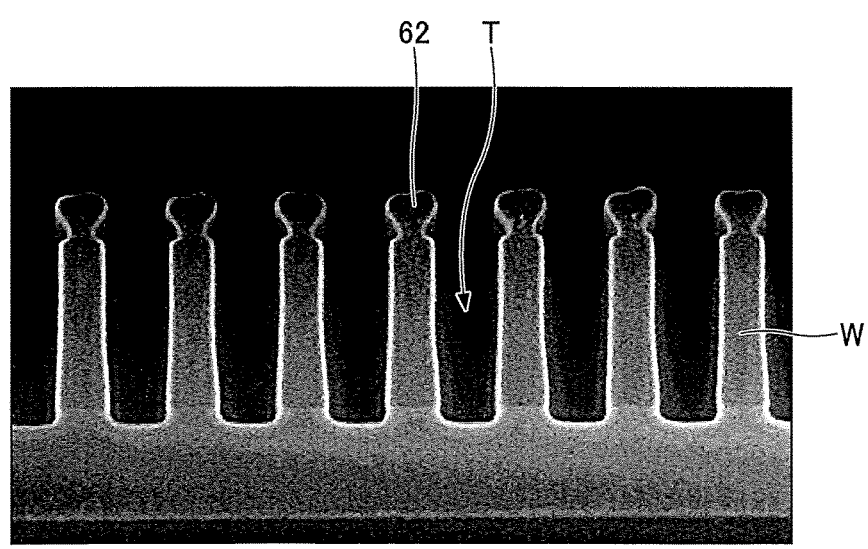

FIGS. 18A and 18B are views showing results of a protective film forming method of a working example 2. The process conditions of each process in the working example 2 were the same as those of the working example 1. In the working example 2, the protective film forming method according to the first embodiment was also performed, and a protective film deposition process constituted of the upward growth process and the etching process are repeated four times. In other words, the upward growth process and the etching process was made one cycle, and the cycle was repeated four times.

FIG. 18A shows a result of the protective film forming method of the working example 2 after performing one cycle of the protective film deposition process. As shown in FIG. 18A, although the upper ends of the protective films 62 slightly swelled laterally, the protective films 62 having preferable shapes were formed as a whole.

FIG. 18B is a result of the protective film forming method of the working example 2 after performing four cycles of the protective film deposition processes. After performing the four cycles, the side surfaces of the protective films 62 around their base and around the upper ends of the trenches T were greatly etched, and the protective films 62 had a shape like an hourglass. There is no problem when a film thickness of one cycle is required, but when a further thicker film thickness is required, if the etching intensity of the etching gas in the etching process is excessive, the regionally excessive etching as shown in FIG. 18B may sometimes occur.

In such a case, the regionally excessive etching can be prevented by performing the protective film forming method according to the second embodiment.

Figure 19A:
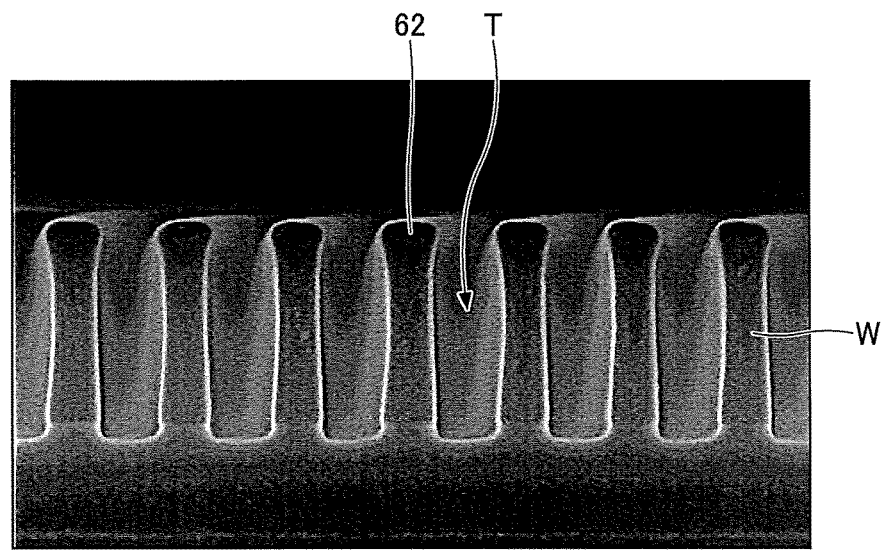
FIGS. 19A and 19B are views showing a result of a working example 3.
Figure 19B:
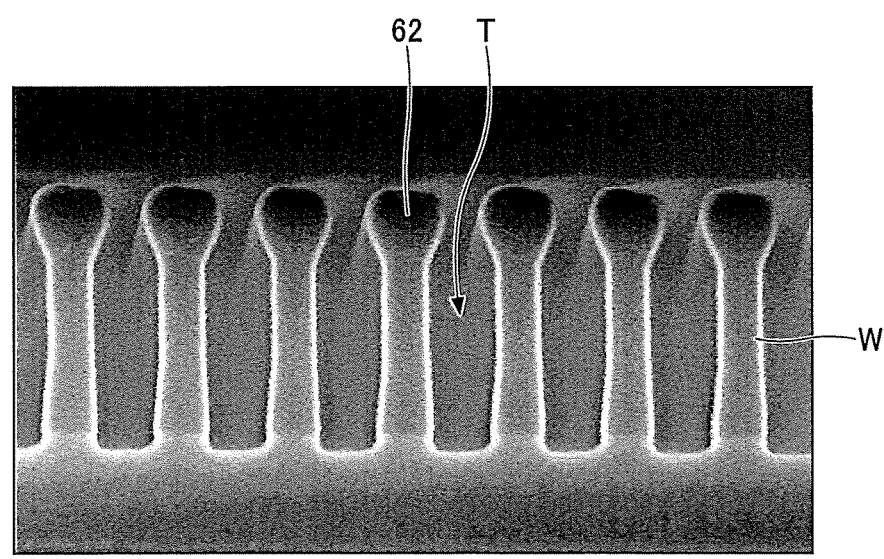

FIGS. 19A and 19B are diagrams showing results of a protective film forming method of a working example 3. In the working example 3, the protective film forming method according to the second embodiment was performed. In the working example 3, the conditions of the upward growth process and the etching process were made the same as those of the working examples 1 and 2. Even in the sacrificial film forming process, the conditions were made the same as those of the working examples 1 and 2 in that TDMAT was used as the source gas and that $H_2O_2$ was used as the oxidation gas. Moreover, the temperature of the wafer W and the pressure in the vacuum chamber 1 were made the same as those of the working examples 1 and 2. The rotational speed of the turntable 2 was set at 60 rom, which was one fourth of 240 rpm set in the upward growth process. With respect to the flow rate of TDMAT, which was the source gas, the flow rate of Ar that was the carrier gas of TDMAT was set at 300 sccm, which was three times as high as the flow rate of 100 sccm in the upward growth process. In addition, the flow rate of the oxidation gas was set the same as that of the upward growth process. Thus, in the sacrificial film forming process, the rotational speed was set lower than that of the upward growth process and the flow rate of the source gas (i.e., the carrier of the source gas) was set higher than that of the upward growth process.

FIG. 19A shows a result of the protective film forming method of the working example 3 after performing one cycle of the protective film deposition process. Because this phase was the same as the phase of FIG. 18A in the working example 2, the same result was obtained as that of FIG. 18A.

FIG. 19B shows a result of the protective film forming method of the working example 3 after performing four cycles of the protective film deposition process. After performing the four cycles, although upper portions of the protective films 62 slightly grew laterally after the four cycles, the shape like the hourglass formed by the excessive etching around the upper ends of the trenches T disappeared. Thus, the result has indicated that an affection caused by the etching can be adjusted (reduced), and that the shapes of the protective films 62 can be adjusted by providing the sacrificial film forming process. By adjusting more various conditions, the lateral growth of the upper portions of the protective films 62 can be removed.

Thus, the working example 3 has indicated that the protective film forming method according to the second embodiment can form a further thicker protective film 62 while fixing a shape of the protective film 62.

As discussed above, according to the protective film forming method of the embodiments, a protective film having a shape that grows thick upward and does not swell laterally can be formed.

Although a preferred embodiment of the film deposition method has been specifically illustrated and described, it is to be understood that minor modifications may be made therein without departing from the sprit and scope of the invention as defined by the claims.

What is claimed is:

1. A protective film forming method, comprising steps of:
   depositing an oxide film of either an organic metal compound or an organic metalloid compound on a flat surface region between adjacent recessed shapes formed in a surface of a substrate; and
   removing a lateral portion of the oxide film deposited on the flat surface region by etching.

2. The protective film forming method according to claim 1, further comprising:
   forming a sacrificial film conformal to the surface of the substrate before the step of depositing the oxide film.

3. The protective film forming method according to claim 2,
   wherein the steps of forming the sacrificial film, depositing the oxide film, and removing the lateral portion of the oxide film are repeated until depositing the oxide film up to a predetermined thickness.

4. The protective film forming method according to claim 3,
   wherein the step of forming the sacrificial film comprises forming a same kind of film as the oxide film deposited in the step of depositing the oxide film.

5. The protective film forming method according to claim 4,
   wherein each of the steps of forming the sacrificial film and depositing the oxide film comprises repeating a cycle of adsorbing a source gas containing the organic metal compound or the organic metalloid on the surface of the substrate, and oxidizing the source gas adsorbed on the surface of the substrate by supplying an oxidation gas to deposit a reaction product of the source gas and the oxidation gas on the surface of the substrate.

6. The protective film forming method according to claim 5,
   wherein the step of oxidizing the source gas by supplying the oxidation gas comprises supplying $H_2o$, $H_2O_2$, $O_2$ or $O_3$ as the oxidation gas while activating the oxidation gas by heat or plasma.

7. The protective film forming method according to claim 5,
   wherein the step of etching the lateral portion of the oxide film comprises supplying an etching gas activated by plasma to the surface of the substrate.

8. The protective film forming method according to claim 7,
   wherein a first cycle time of the step of repeating the cycle of adsorbing the source gas on the surface of the substrate and oxidizing the source gas adsorbed on the surface of the substrate in the step of forming the sacrifice film is longer than a second cycle time of the step of repeating the cycle of adsorbing the source gas on the surface of the substrate and oxidizing the source gas adsorbed on the surface of the substrate in the step of depositing the oxide film.

9. The film deposition method according to claim 8,
   wherein the first cycle time is set at 120 times or more per minute, and
   the second cycle time is set at 80 times or less per minute.

10. The protective film forming method according to claim 9,
    wherein the substrate is placed on a turntable provided in a process chamber along a circumferential direction of the turntable, wherein the process chamber includes an adsorption region to adsorb the source gas on the surface of the substrate, an oxidation region to oxidize the source gas adsorbed on the surface of the substrate, and an etching region to etch the lateral portion of the oxide film, provided above the turntable and apart from each other in the circumferential direction of the turntable, wherein the step of forming the sacrificial film comprises rotating the turntable at a rotational speed of 80 rpm or lower to perform the step of repeating the cycle of adsorbing the source on the surface of the substrate, and oxidizing the source gas adsorbed on the surface of the substrate by causing the substrate to sequentially pass the adsorption region and the oxidation region, wherein the step of depositing the oxidation film comprises rotating the turntable at a rotational speed of 120 rpm or lower to perform the step of repeating the cycle of adsorbing the source on the surface of the substrate, and oxidizing the source gas adsorbed on the surface of the substrate by causing the substrate to sequentially pass the adsorption region and the oxidation region, and wherein the step of etching the lateral portion of the oxide film comprises rotating the turntable at a predetermined rotational speed while stopping the supply of the source gas and the oxidation gas in the adsorption region and the oxidation region, respectively, to perform the step of etching the lateral portion of the oxide film at a predetermined cycle while stopping the steps of forming the sacrificial film and depositing the oxide film.

11. The protective film forming method according to claim 8,
wherein a first flow rate of the source gas supplied in the step of adsorbing the source gas on the surface of the substrate in the step of forming the sacrificial film is greater than a second flow rate of the source gas supplied in the step of adsorbing the source gas on the surface of the substrate in the step of depositing the oxide film.

12. The protective film forming method according to claim 1,
wherein the oxide film of the organic metal compound is a high-k film.

13. The protective film forming method according to claim 1,
wherein the organic metal compound is an organic titanium.

14. The protective film forming method according to claim 13,
wherein the organic titanium is tetrakis(dimethylamino) titanium.

15. The protective film forming method according to claim 1,
wherein the organic metalloid compound is an organic silane.

16. The protective film forming method according to claim 1,
wherein the recessed shapes are trenches.

* * * * *